United States Patent
Sawada

(10) Patent No.: US 9,349,565 B2
(45) Date of Patent: May 24, 2016

(54) MULTIPOLE LENS, ABERRATION CORRECTOR, AND ELECTRON MICROSCOPE

(71) Applicant: JEOL Ltd., Tokyo (JP)

(72) Inventor: Hidetaka Sawada, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/688,045

(22) Filed: Apr. 16, 2015

(65) Prior Publication Data

US 2015/0332889 A1 Nov. 19, 2015

(30) Foreign Application Priority Data

Apr. 17, 2014 (JP) .................................. 2014-85407

(51) Int. Cl.
*G21K 5/04* (2006.01)
*H01J 37/141* (2006.01)
*H01J 37/06* (2006.01)
*H01J 37/26* (2006.01)

(52) U.S. Cl.
CPC ............... *H01J 37/141* (2013.01); *H01J 37/06* (2013.01); *H01J 37/26* (2013.01); *H01J 2237/063* (2013.01); *H01J 2237/1415* (2013.01)

(58) Field of Classification Search
USPC ........ 250/396 R, 397, 396 ML, 492.1, 492.2, 250/492.21, 492.22, 492.23, 492.3
See application file for complete search history.

(56) References Cited

U.S. PATENT DOCUMENTS

| 6,946,833 B1 * | 9/2005 | Logue ................ G01N 27/9013 324/225 |
| 2005/0029466 A1 * | 2/2005 | Kawai ....................... H01J 9/18 250/396 R |
| 2013/0153782 A1 * | 6/2013 | Ren .......................... H01J 3/20 250/398 |

FOREIGN PATENT DOCUMENTS

JP 2010114068 A 5/2010

OTHER PUBLICATIONS

M. Haider et al., "Correction of the spherical aberration of a 200 kV TEM by means of a Hexapole-corrector"; Optik 1995, vol. 99, No. 4, pp. 167-179.
Katsumi Ura, "Nano Electron Optics", p. 284.

* cited by examiner

*Primary Examiner* — Nicole Ippolito
(74) *Attorney, Agent, or Firm* — The Webb Law Firm

(57) ABSTRACT

A multipole lens (100) which can produce static magnetic fields showing different strengths in the direction of travel of an electron beam has lens subasssemblies (10a, 10b, 10c) stacked on top of each other. The lens subassemblies (10a, 10b, 10c) have yokes (14a, 14b, 14c), respectively, and polar elements (12a, 12b, 12c), respectively. The polar elements (12a, 12b, 12c) have base portions (13a, 13b, 13c), respectively, magnetically coupled to the yokes (14a, 14b, 14c), respectively, and front end portions (11a, 11b, 11c), respectively, magnetically coupled to the base portions (13a, 13b, 13c), respectively. Magnetic field separators (20, 22) made of a nonmagnetic material are mounted between the front end portions (11a, 11b, 11c) which are successively adjacent to each other in the direction of stacking of the lens subassemblies (10a, 10b, 10c).

13 Claims, 17 Drawing Sheets

MULTIPOLE LENS, ABERRATION CORRECTOR, AND ELECTRON MICROSCOPE

BACKGROUND OF THE INVENTION

1. Field of the Invention

The present invention relates to a multipole lens, aberration corrector, and electron microscope.

2. Description of Related Art

In an electron microscope such as a transmission electron microscope (TEM) or a scanning electron microscope (SEM), spherical aberration and chromatic aberration are one type of factor leading to decreases in resolution. In an electron microscope, if spherical aberration or chromatic aberration is corrected, the resolution will be improved. In a spherical aberration corrector or in a chromatic aberration corrector, magnetic or electric fields are produced by the use of multipole elements to correct spherical aberration or chromatic aberration.

For example, in M. Haider, G. Braunshausen, E. Schwan: Optik 1995, No. 4, pp. 167-179, a multipole element producing only magnetic fields is disclosed as a multipole element used in a spherical aberration corrector, and this multipole element is fabricated by winding a coil on a dodecapole (12-pole) polepiece made of soft iron that is a soft magnetic material. In the technique of M. Haider, G. Braunshausen, E. Schwan: Optik 1995, No. 4, pp. 167-179, a liner tube that is a metal tube for evacuating the inside is placed in a central hole formed in the multipole element. Only the inside is evacuated. The multipole element itself is placed outside a vacuum. Therefore, an electron beam passes through the vacuum but a magnetic field produced by the multipole element leaks into the liner tube made of a nonmagnetic material, thus producing a desired symmetric field with respect to the electron beam.

"Nano Electron Optics", Katsumi Ura, p. 284 also discloses a dodecapole element capable of producing static electric or magnetic fields. Each polepiece is made of a metal consisting of a soft magnetic material. A static magnetic field is generated by a coil. A static electric field can be produced at the same time by applying voltages electrically. The multipole element itself is placed in a vacuum. The electron beam passes through the center of the multipole element and is affected by a multipolar field including the static electric and magnetic fields.

In addition, JP-A-2010-114068 discloses a dodecapole element capable of producing static electric and magnetic fields in the same way as the multipole element discussed above. The multipole element disclosed in JP-A-2010-114068 is different from the multipole element disclosed in M. Haider, G. Braunshausen, E. Schwan: Optik 1995, No. 4, pp. 167-179 in that only the multipole element for producing static magnetic fields is placed in a vacuum and that the multipole element consisting of polepieces and coils for producing static electric fields is placed outside the vacuum.

The above-described multipole elements can produce only a static magnetic field or a field of superimposed static electric and magnetic fields having a constant intensity in the direction of motion of an electron beam. That is, the above-described multipole elements cannot produce static magnetic fields that are different in intensity relative to the direction of motion of an electron beam.

SUMMARY OF THE INVENTION

In view of the foregoing problem, the present invention has been made. One object associated with some aspects of the present invention is to provide a multipole lens capable of producing static magnetic fields which are different in intensity relative to the direction of motion of an electron beam. It is another object associated with some aspects of the invention to provide an aberration corrector including this multipole lens. It is a further object of the invention to provide an electron microscope including this aberration corrector.

(1) A multipole lens associated with the present invention has a plurality of lens subassemblies stacked on top of each other, each of the lens subassemblies having a yoke and polar elements. Each of the polar elements has a base portion magnetically coupled to the yoke and a front end portion magnetically coupled to the base portion. Magnetic field separators made of a nonmagnetic material are mounted between the front end portions which are successively adjacent to each other in the direction of stacking of the lens subassemblies.

In this multipole lens, the front end portions which are successively adjacent to each other in the direction of stacking of the lens subassemblies can be magnetically isolated from each other by the magnetic field separators. Accordingly, in this multipole lens, static magnetic fields of different intensities relative to the direction of motion of the electron beam can be produced by separately controlling static magnetic fields generated by the polar elements arranged in the direction of stacking of the lens subassemblies. Furthermore, in this multipole lens, the boundaries of the static magnetic fields produced by the adjacent front end portions can be made clearer as compared with the case where the front end portions which are successively adjacent to each other in the direction of stacking of the lens subassemblies are placed in contact with each other.

(2) In one feature of this multipole lens, the magnetic field separators may have electrical conductivity.

In this multipole lens, the front end portions which are successively adjacent to each other in the direction of stacking of the lens subassemblies can be made equipotential.

(3) In another feature of this multipole lens, there may be further provided terminals for applying voltages to the front end portions.

This multipole lens can produce static electric fields, in addition to static magnetic fields (4) In a further feature of this multipole lens, the base portions may be spaced from the front end portions.

In this multipole lens, when it is incorporated, for example, in an electron microscope, vacuum partitions for maintaining the interior of the microscope in a vacuum can be disposed between the base portions and the front end portions. Consequently, the front end portions can be placed in evacuated spaces and the base portions can be placed outside a vacuum. As a result, electrical discharging from the front end portions can be avoided. Furthermore, coils that would tend to deteriorate the vacuum can be placed outside the vacuum.

(5) In a yet other feature of this multipole lens, electric fields produced by the polar elements which are successively adjacent to each other in the direction of stacking may be equal in strength. Magnetic fields produced by the polar elements which are successively adjacent to each other in the direction of stacking may be different in strength.

(6) In a still other feature of this multipole lens, the magnetic field separators may be in contact with their respective ones of the front end portions which are adjacent to their respective magnetic field separators in the direction of stacking.

In this multipole lens, the front end portions can be mechanically supported by the magnetic field separators.

(7) In an additional feature of this multipole lens, first support portions made of a nonmagnetic material may be mounted between the base portions which are successively adjacent to each other in the direction of stacking.

In this multipole lens, the base portions can be supported by the first support portions while being magnetically isolated from each other.

(8) In a still other feature of this multipole lens, second support portions made of a nonmagnetic material may be mounted between the yokes which are successively adjacent to each other in the direction of stacking.

In this multipole lens, the yokes can be supported by the second support portions while being magnetically isolated from each other.

(9) In a yet further feature of this multipole lens, there may be further provided first and second coils mounted on the base portions. Each of the second coils has a fewer number of turns than each of the first coils.

In this multipole lens, principal static magnetic fields can be produced by the first coils. Adjustive static magnetic fields can be produced by the second coils.

(10) An aberration corrector associated with the present invention includes a multipole lens associated with the present invention.

In this aberration corrector, aberrations can be corrected.

(11) In one feature of this aberration corrector, the multipole lens may produce an electromagnetic field for canceling out chromatic aberration.

In this aberration corrector, chromatic aberration can be corrected.

(12) An electron microscope associated with the present invention includes an aberration corrector associated with the present invention.

In this electron microscope, aberrations can be corrected and so higher resolution can be accomplished.

(13) In one feature of this electron microscope, vacuum partitions may be disposed between the base portions and the front end portions.

In this electron microscope, aberrations can be corrected and so higher resolution can be accomplished.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Multipole Lens

Figure 1:
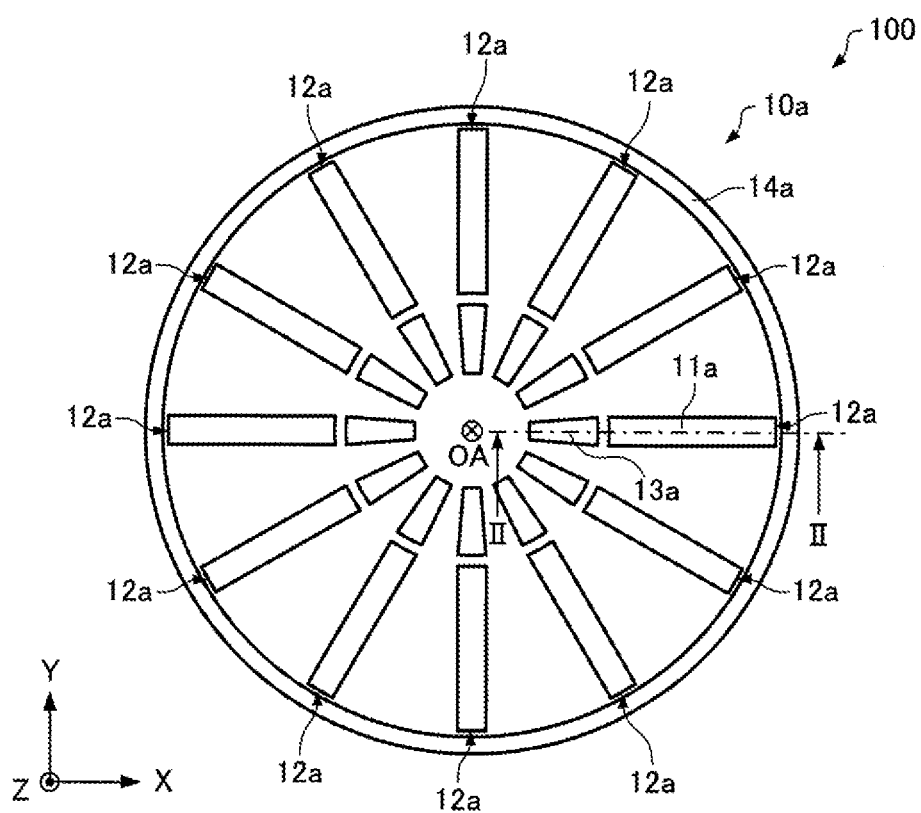
FIG. 1 is a schematic plan view of a multipole lens associated with a first embodiment of the present invention.
Figure 2:
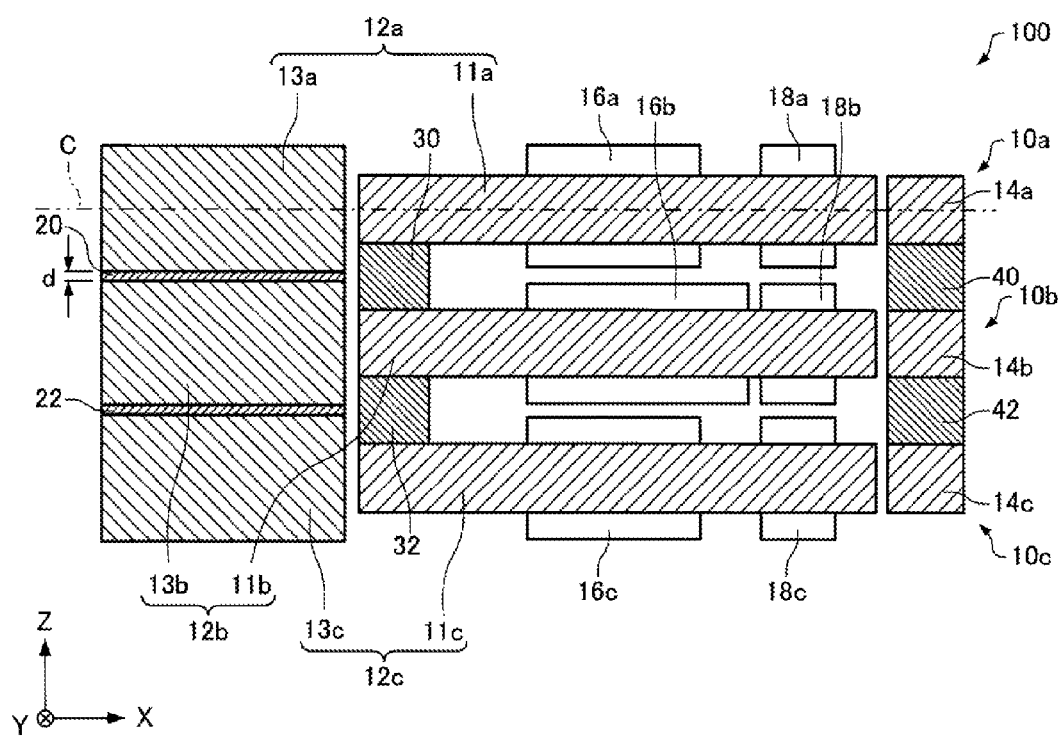
FIG. 2 is a schematic cross-sectional view of the multipole lens shown in FIG. 1.
Figure 3:
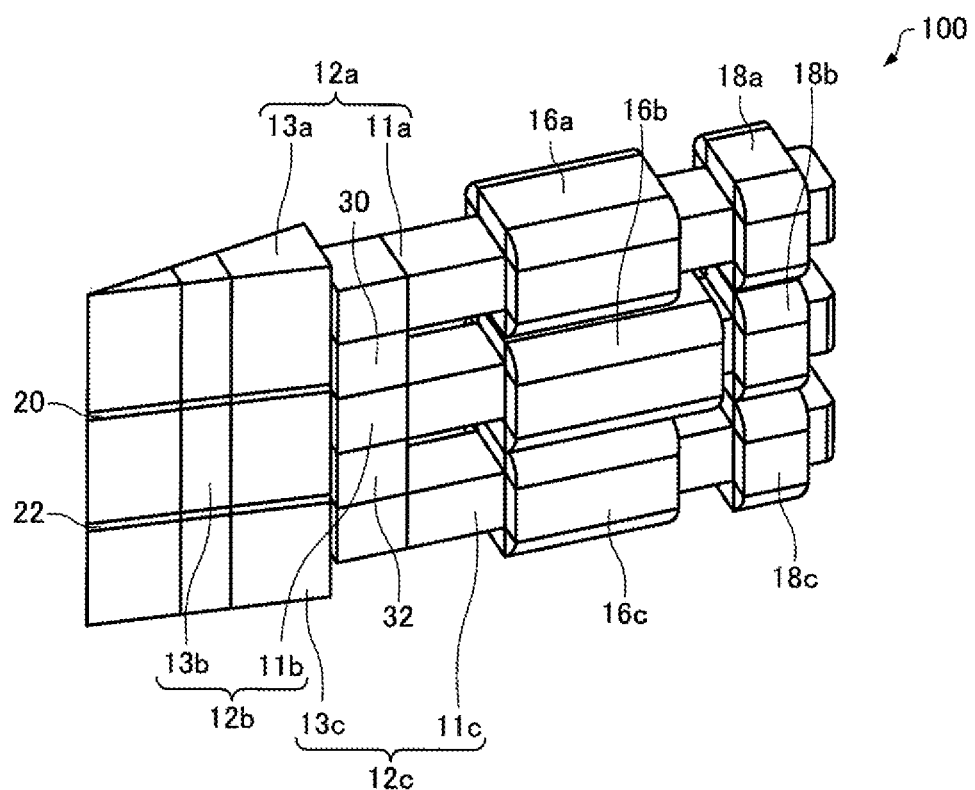
FIG. 3 is a schematic perspective view of polar elements of the multipole lens shown in FIGS. 1 and 2.
Figure 4:
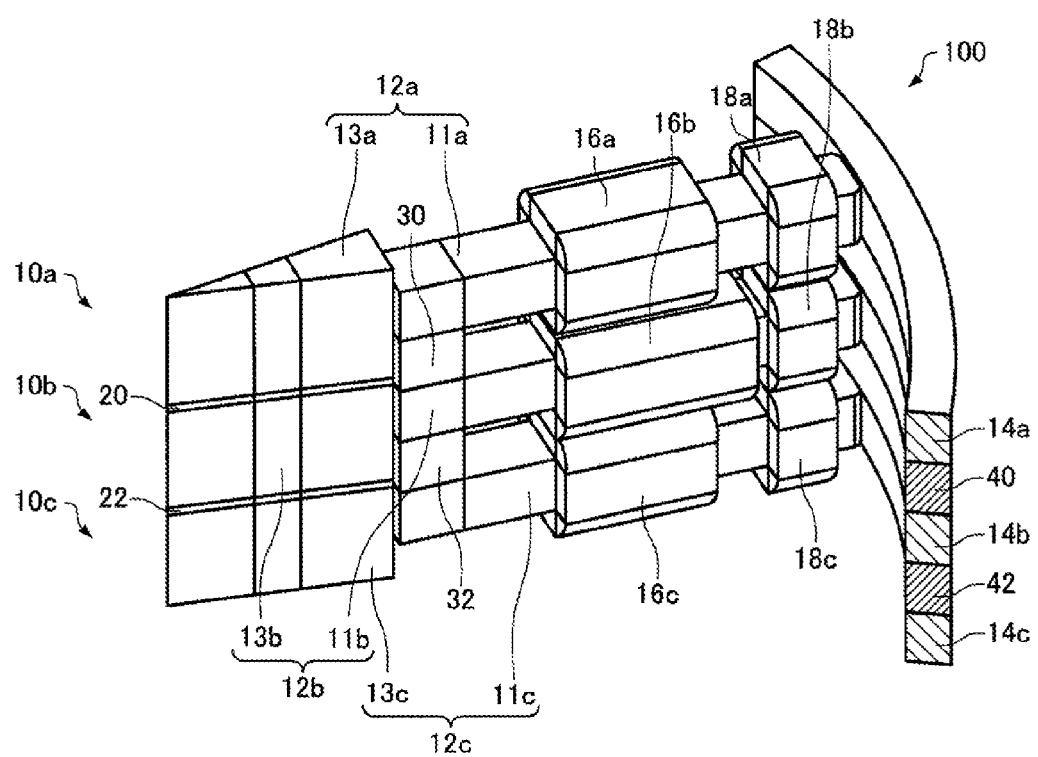
FIG. 4 is a schematic, partial cutaway cross sectional perspective view of the multipole lens shown in FIGS. 1 and 2.

A multipole lens associated with one embodiment of the present invention is first described by referring to FIGS. 1-4. FIG. 1 is a schematic plan view of the multipole lens, generally indicated by reference numeral 100. FIG. 2 is a schematic cross-sectional view of the multipole lens 100, taken on line II-II of FIG. 1. FIG. 3 is a schematic perspective view of polar elements 12a, 12b, and 12c of the multipole lens 100. FIG. 4 is a schematic, partial cutaway cross sectional perspective view of the multipole lens 100. In FIGS. 1 and 2, X-, Y-, and Z-axes are shown as mutually perpendicular axes.

As shown in FIGS. 1-4, the multipole lens 100 includes a first lens subassembly 10a, a second lens subassembly 10b, a third lens subassembly 10c, magnetic field separators 20, 22, first support portions 30, 32, and second support portions 40, 42. The first lens subassembly 10a has the polar elements 12a, a yoke 14a, and coils 16a, 18a.

The polar elements 12a are plural (twelve, in the illustrated example) in number and are arranged symmetrically with respect to the optical axis OA of the multipole lens 100. The 12 polar elements 12a are angularly regularly spaced from each other at intervals of 30 degrees about the optical axis OA. In the illustrated example, the center axis C (see FIG. 2) of each of the 12 polar elements 12a is located within a plane which is perpendicular to the optical axis OA and which is parallel to the X-Y plane. The center axis C of each polar element 12a perpendicularly intersects with the optical axis OA of the multipolar lens 100 at one point on the optical axis OA. In the illustrated example, the optical axis OA is parallel to the Z-axis. The center axis C of each polar element 12a passes through the center of each polar element 12a and extends longitudinally of each polar element 12a.

Each polar element 12a has a base portion 11a and a front end portion 13a. The base portion 11a is magnetically coupled to the yoke 14a. In the illustrated example, the base portion 11a is spaced from the yoke 14a but magnetic flux leaks into, and propagates through, the space between the base portion 11a and the yoke 14a. That is, the magnetic flux forms a magnetic circuit. Alternatively, the base portion 11a may be in contact with the yoke 14a. The base portion 11a forms magnetic cores of the coils 16a and 18a.

The front end portion 13a of each polar element 12a is magnetically coupled to the base portion 11a. Although the front end portion 13a is spaced from the base portion 11a, magnetic flux leaks into, and propagates through, the space between the base portion 11a and the front end portion 13a, thus forming a magnetic circuit. As described later, when the multipole lens 100 is incorporated in an electron microscope, a vacuum partition (liner tube) is disposed between the front end portion 13a and the base portion 11a.

A terminal (not shown) is attached to the front end portion 13a to permit a voltage to be applied to the front end portion 13a via the terminal. A voltage is applied to the front end portion 13a via the terminal. A static electric field can be generated from the front end portion 13a. The terminal is mounted only on the front end portion 13a out of the front end portions 13a, 13b, and 13c arrayed in the direction in which the lens subassemblies 10a, 10b, and 10c are stacked. No terminals are mounted on the other front end portions 13b and 13c. Since the front end portions 13a, 13b, and 13c are electrically connected together by the magnetic field separators 20 and 22, voltages are applied to the front end portions 13b and 13c by applying a voltage to the front end portion 13a.

The yoke 14a permits magnetic flux generated by the coils 16a and 18a to be guided to the polar elements 12a effectively. The yoke 14a is formed annularly as viewed within a plane, i.e., as viewed along the Z-axis. The plural polar elements 12a are arranged inside the yoke 14a. The polar elements 12a and yoke 14a are made of a soft magnetic material (such as Permalloy).

The coils 16a and 18a are wound on the base portion 11a and generate magnetic flux. The first coil (main coil) 16a is greater in number of turns than the second coil (auxiliary coil) 18a.

The second lens subassembly 10b has the polar elements 12b, a yoke 14b, and coils 16b, 18b which are similar in function to the aforementioned members 12a, 14a, 16a, and 18a, respectively, constituting the first lens subassembly 10a except that each first coil 16b is greater in number of turns than each first coil 16a. Therefore, a detailed description of the members 12b, 14b, 16b, and 18b constituting the second lens subassembly 10b is omitted.

The third lens subassembly 10c has the polar elements 12c, a yoke 14c, and coils 16c, 18c which are similar in function to the aforementioned members 12a, 14a, 16a, and 18a constituting the first lens subassembly 10a. Therefore, a detailed description of the members 12c, 14c, 16c, and 18c constituting the third lens subassembly 10c is omitted.

All of the first coils (12 first coils 16a, 12 first coils 16b, and 12 first coils 16c) constituting the multipole lens 100 are formed by lead wires connected from one terminal of one power supply (not shown) to another terminal in a unicursal manner. That is, all the first coils 16a, 16b, and 16c forming the multipole lens 100 are series wound. Therefore, if noise is superimposed on currents flowing through the first coils 16a, 16b, and 16c, magnetic fields produced from the coils 16a, 16b, and 16c due to the noise cancel out each other. Consequently, disturbance of the electron beam can be reduced.

A power supply (not shown) is provided for each one of the second coils 18a, 18b, and 18c. The magnitudes of the magnetic fields generated by the second coils 18a, 18b, and 18c, respectively, can be controlled by controlling the currents supplied from their respective power supplies. Consequently, the second coils 18a, 18b, and 18c can be used as auxiliary coils for producing adjustive magnetic fields.

In this way, the multipole lens 100 can obtain high stability efficiently by the use of the first coils 16a, 16b, and 16c and the second coils 18a, 18b, and 18c. The first coils 16a, 16b, and 16c have high stability because all of these coils are supplied with current from one power supply. The second coils 18a, 18b, and 18c produce the adjustive magnetic fields.

The first lens subassembly 10a, second lens subassembly 10b, and third lens subassembly 10c are stacked on top of each other in the direction of the optical axis OA of the multipole lens 100 (i.e., along the Z-axis). Therefore, the polar elements 12a, 12b, and 12c are overlapped, as viewed in the direction of the optical axis OA. Also, the yokes 14a, 14b, and 14c are overlapped, as viewed in the direction of the optical axis OA.

The magnetic field separators 20 and 22 are mounted between the front end portions 13a, 13b, and 13c which are successively adjacent to each other in the direction of stacking of the lens subassemblies 10a, 10b, and 10c (i.e., in the direction of the optical axis OA (along the Z-axis)). In the illustrated example, the magnetic field separator 20 is mounted between the front end portion 13a of the first lens subassembly 10a and the front end portion 13b of the second lens subassembly 10b. The magnetic field separator 22 is mounted between the front end portion 13b of the second lens subassembly 10b and the front end portion 13c of the third lens subassembly 10c.

The magnetic field separators 20 and 22 are in contact with respective ones of the front end portions 13a, 13b, and 13c which are successively adjacent to each other in the direction of stacking of the lens subassemblies 10a, 10b, and 10c. In the illustrated example, the magnetic field separator 20 is in contact with the front end portion 13a of the first lens subassembly 10a and with the front end portion 13b of the second lens subassembly 10b. The magnetic field separator 22 is in contact with the front end portion 13b of the second lens subassembly 10b and with the front end portion 13c of the third lens subassembly 10c.

The magnetic field separators 20 and 22 are made of a nonmagnetic material. Therefore, the magnetic field separator 20 does not magnetically couple the front end portion 13a of the first lens subassembly 10a and the front end portion 13b of the second lens subassembly 10b to each other. Similarly, the magnetic field separator 22 does not magnetically couple the front end portion 13b of the second lens subassembly 10b and the front end portion 13c of the third lens subassembly 10c to each other. The magnetic field separators 20 and 22 have electrical conductivity. Consequently, the front end portion 13a of the first lens subassembly 10a and the front end portion 13b of the second lens subassembly 10b are electrically connected together by the magnetic field separator 20. Similarly, the front end portion 13b of the second lens subassembly 10b and the front end portion 13c of the third lens subassembly 10c are electrically connected together by the magnetic field separator 22. The magnetic field separators 20 and 22 are made of copper (Cu), stainless steel, or the like. The thickness d of the magnetic field separators 20 and 22, taken along the Z-axis (see FIG. 2), is, for example, between approximately 1 mm and 3 mm, inclusively.

The first support portions (base portion support portions) 30 and 32 are mounted between respective ones of the base portions 11a, 11b, and 11c which are successively adjacent to each other in the direction of stacking of the lens subassemblies 10a, 10b, and 10c. In the illustrated example, the first support portion 30 is mounted between the base portion 11a of the first lens subassembly 10a and the base portion 11b of the second lens subassembly 10b. The first support portion 32 is mounted between the base portion 11b of the second lens subassembly 10b and the base portion 10c of the third lens subassembly 10c. The first support portions 30 and 32 support the base portions 11a, 11b, and 11c. The first support portions 30 and 32 are made, for example, of a nonmagnetic material. Therefore, the first support portion 30 does not magnetically couple the base portion 11a of the first lens subassembly 10a and the base portion 11b of the second lens subassembly 10b to each other. Similarly, the first support portion 32 does not magnetically couple the base portion 11b of the second lens subassembly 10b and the base portion 11c of the third lens subassembly 10c to each other. The first support portions 30 and 32 are made of copper (Cu), stainless steel, or the like.

The second support portions (yoke support portions) 40 and 42 are mounted between respective ones of the yokes 14a, 14b, and 14c which are successively adjacent to each other in the direction of stacking of the lens subassemblies 10a, 10b, and 10c. In the illustrated example, the second support portion 40 is mounted between the yoke 14a of the first lens subassembly 10a and the yoke 14b of the second lens subassembly 10b. The second support portion 42 is mounted between the yoke 14b of the second lens subassembly 10b and the yoke 14c of the third lens subassembly 10c. The second support portions 40 and 42 support the yokes 14a, 14b, and 14c. The second support portions 40 and 42 are made, for example, of a nonmagnetic material.

Therefore, the second support portion 40 does not magnetically couple the yoke 14a of the first lens subassembly 10a and the yoke 14b of the second lens subassembly 10b to each other. Similarly, the second support portion 42 does not magnetically couple the yoke 14b of the second lens subassembly 10b and the yoke 14c of the third lens subassembly 10c to each other. The second support portions 40 and 42 are made of copper (Cu), stainless steel, or the like.

In the description of the present embodiment, the three lens subassemblies 10a, 10b, and 10c are stacked on top of each other in the multipole lens 100. The number of stacked lens subassemblies is not specifically restricted if the number is two or more. That is, the multipole lens 100 may produce two or more stages of magnetic fields of magnitudes which are different relative to the direction of the optical axis OA.

The multipole lens 100 has the following features. In the multipole lens 100, the plural lens subassemblies 10a, 10b, and 10c are stacked on top of each other. The magnetic field separators 20 and 22 made of a nonmagnetic material are mounted between respective ones of the front end portions 13a, 13b, and 13c of the polar elements 12a, 12b, and 12c which are successively adjacent to each other in the direction of stacking of the lens subassemblies 10a, 10b, and 10c. Therefore, in the multipole lens 100, the front end portions 13a, 13b, and 13c which are successively adjacent to each other in the direction of stacking of the lens subassemblies 10a, 10b, and 10c can be magnetically isolated from each other by the magnetic field separators 20 and 22. Consequently, in the multipole lens 100, static magnetic fields having different strengths with respect to the direction of travel of the electron beam can be produced by separately controlling the static magnetic fields produced by the polar elements 12a, 12b, and 12c, respectively, arrayed in the direction of stacking of the lens subassemblies 10a, 10b, and 10c.

Figure 5:
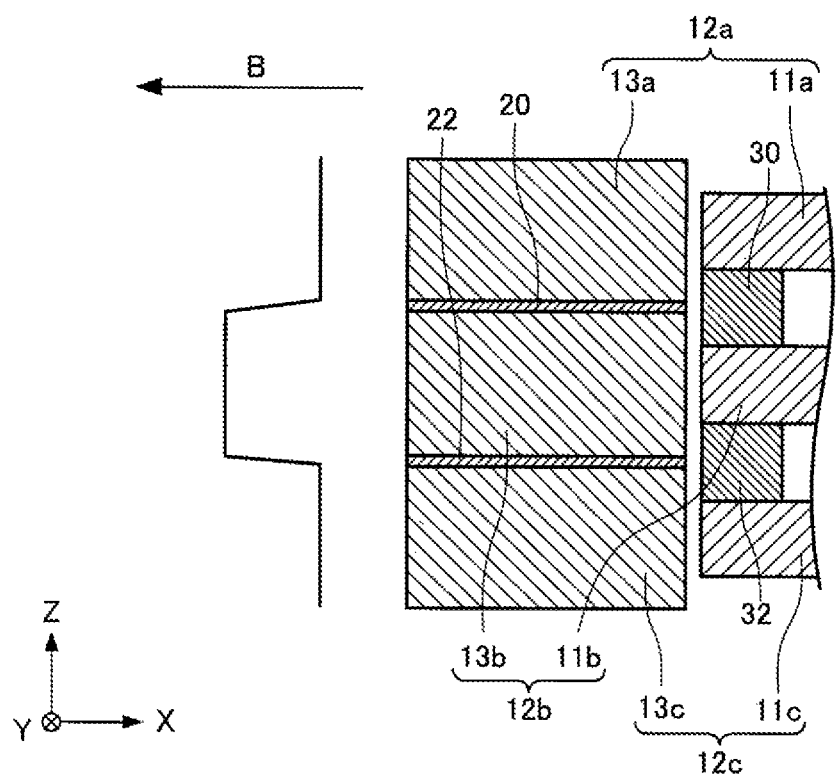
FIG. 5 is a diagram schematically illustrating static magnetic fields produced by the multipole elements of the multipole lens shown in FIGS. 1-4 in a case where magnetic field separators made of a nonmagnetic material are mounted between successively adjacent front end portions of the multipole elements.
Figure 6:
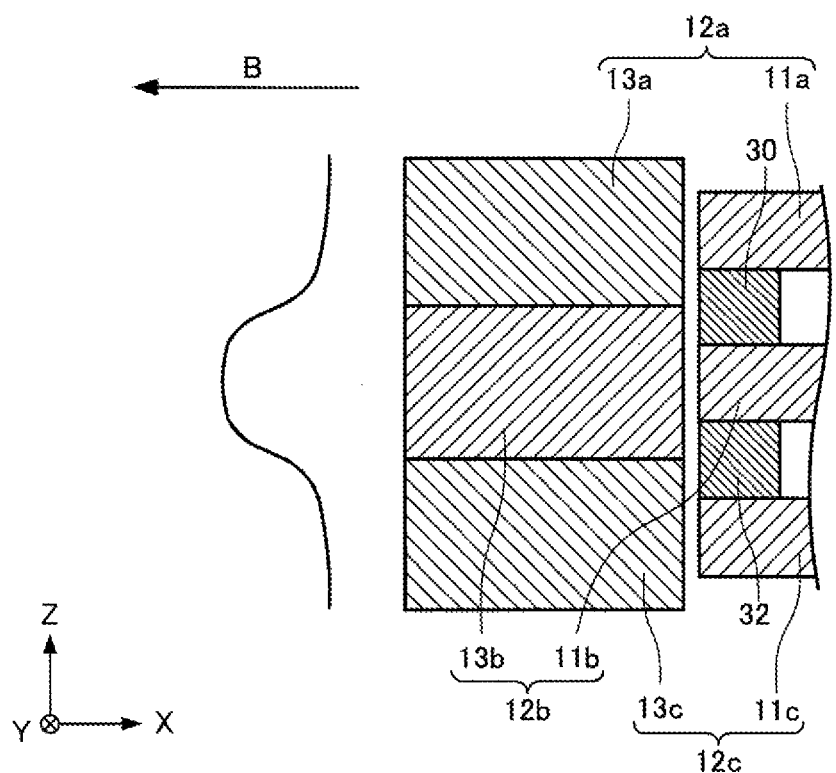
FIG. 6 is a diagram schematically illustrating static magnetic fields produced by the multipole elements of the multipole lens shown in FIGS. 1-4 in a case where the successively adjacent front end portions of the multipole elements are placed in contact with each other.

FIG. 5 schematically illustrates static magnetic fields produced by the multipolar elements in a case where the magnetic field separator 20 made of a nonmagnetic material is mounted between the front end portions 13a and 13b which are adjacent to each other in the direction of stacking of the lens subassemblies 10a, 10b, and 10c and where the magnetic field separator 22 made of a nonmagnetic material is mounted between the front end portions 13b and 13c which are adjacent to each other in the direction of stacking of the lens subassemblies 10a, 10b, and 10c. FIG. 6 schematically illustrates static magnetic fields generated by the multipolar elements in a case where the front end portions 13a and 13b which are adjacent to each other in the direction of stacking of the lens subassemblies 10a, 10b, and 10c are placed in contact with each other and where the front end portions 13b and 13c which are adjacent to each other in the direction of stacking of the lens subassemblies 10a, 10b, and 10c are placed in contact with each other. In FIGS. 5 and 6, the arrows B indicate the magnitudes of the static magnetic fields.

Where the front end portions 13a and 13b are brought into contact with each other and the front end portions 13b and 13c are brought into contact with each other as shown in FIG. 6, the boundary between the static magnetic fields generated by the front end portions 13a and 13b, respectively, and the boundary between the static magnetic fields generated by the front end portions 13b and 13c, respectively, are not clear. In contrast, where the magnetic field separator 20 of a nonmagnetic material is mounted between the front end portions 13a and 13b and the magnetic field separator 22 of a nonmagnetic material is mounted between the front end portions 13b and 13c as shown in FIG. 5, the boundary between the static magnetic fields generated by the front end portions 13a and 13b, respectively, and the boundary between the static magnetic fields generated by the front end portions 13b and 13c, respectively, are clear.

Accordingly, in the multipole lens 100, the magnetic field separators 20 and 22 made of a nonmagnetic material are mounted between respective ones of the front end portions 13a, 13b, and 13c of the polar elements 12a, 12b, and 12c which are successively adjacent to each other in the direction of stacking of the lens subassemblies 10a, 10b, and 10c. In consequence, plural stages of static magnetic fields having different strengths with respect to the direction of travel of the electron beam can be produced accurately.

In the multipole lens 100, the magnetic field separators 20 and 22 have electrical conductivity and so in the multipole lens 100, the front end portions 13a, 13b, and 13c of the polar elements 12a, 12b, and 12c which are successively adjacent to each other in the direction of stacking of the lens subassemblies 10a, 10b, and 10c can be made equipotential. Therefore, in the multipole lens 100, static magnetic fields which are constant along the direction of travel of the electron beam can be produced. That is, in the multipole lens 100, static magnetic fields showing different strengths relative to the direction of travel of the electron beam can be produced while producing static electric fields that are constant in strength along the direction of travel of the electron beam.

Furthermore, in the multipole lens 100, the magnetic field separators 20 and 22 have electrical conductivity as described previously. Therefore, the front end portions 13a, 13b, and 13c of the polar elements 12a, 12b, and 12c which are successively adjacent to each other in the direction of stacking of the lens subassemblies 10a, 10b, and 10c are equipotential. In the multipole lens 100, power supplies for producing static electric fields that need to have a high degree of stability can be made common. Accordingly, in the multipole lens 100, a power supply of complex configuration is not needed unlike the case where power supplies are mounted for the front end portions 13a, 13b, and 13c, respectively, of the polar elements 12a, 12b, and 12c which are successively adjacent to each other in the direction of stacking of the lens subassemblies 10a, 10b, and 10c. Rather, an optical system of high stability can be accomplished. As a result, high-resolution images can be obtained.

The multipole lens 100 includes the terminals for applying voltages to the front end portions 13a, 13b, and 13c of the polar elements 12a, 12b, and 12c and so the multipole lens 100 can produce static electric fields in addition to static magnetic fields.

In the multipole lens 100, the base portion 11a and the front end portion 13a are spaced from each other in each polar element 12a. Similarly, in each polar element 12b, the base portion 11b sand the front end portion 13b are spaced from each other. In each polar element 12c, the base portion 11c and the front end portion 13c are spaced from each other. Therefore, when the multipole lens 100 is incorporated into an electron microscope, a vacuum partition such as a liner tube for maintaining the interior in a vacuum can be placed between the base portion 11b and the front end portion 13b.

Figure 7:
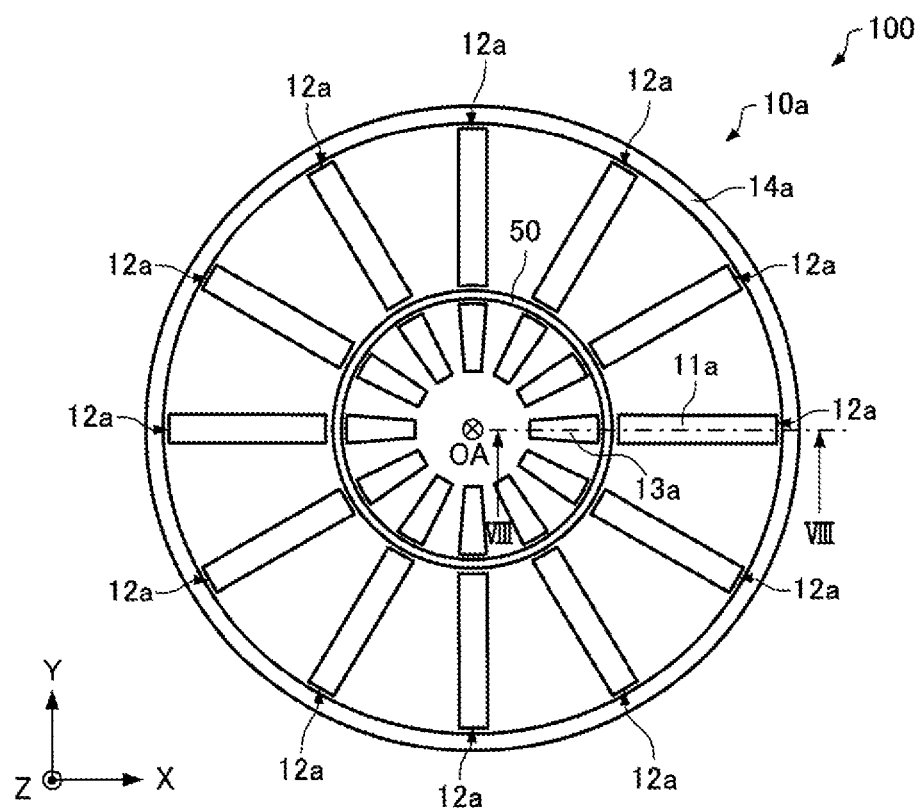
FIG. 7 is a schematic plan view of the multipole lens shown in FIGS. 1-4, and in which the lens is mounted in an electron microscope.
Figure 8:
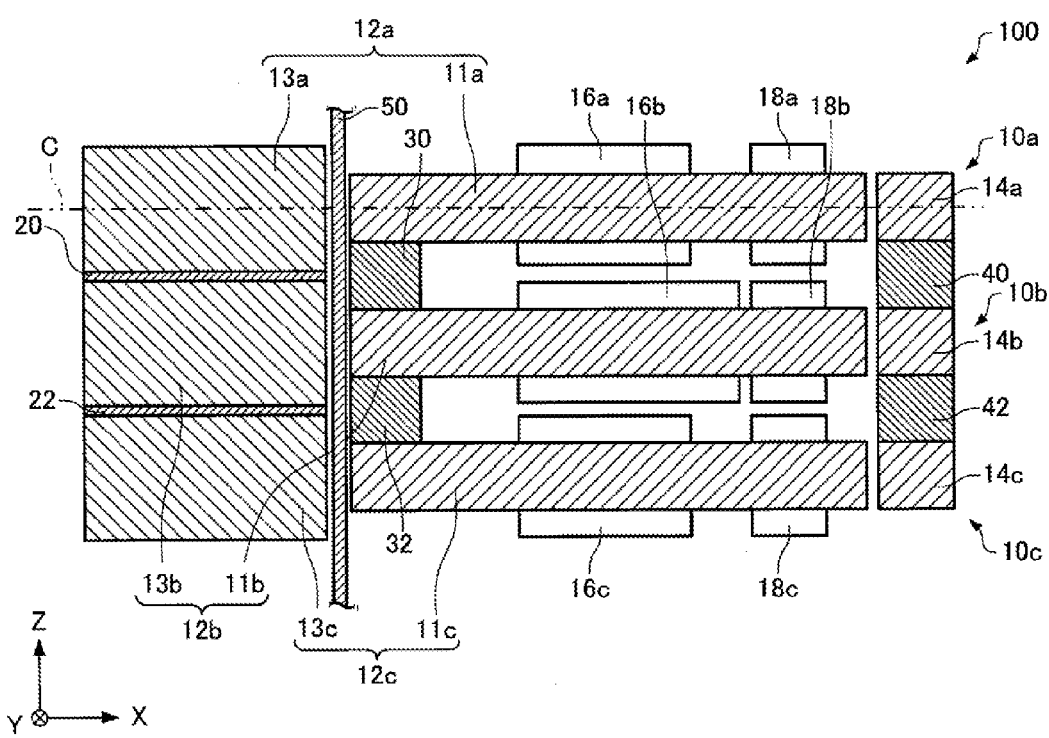
FIG. 8 is a schematic cross-sectional view of the multipole lens shown in FIG. 7, the lens being mounted in the electron microscope.

FIG. 7 is a schematic plan view of the multipole lens 100, and in which the lens has been incorporated in an electron microscope. FIG. 8 is a schematic cross section taken on line VIII-VIII of FIG. 7, showing the state in which the multipole lens 100 has been incorporated in the microscope.

In the multipole lens 100, a vacuum partition 50 as made of a cylindrical member is disposed between the base portion 11b and the front end portion 13b as shown in FIGS. 7 and 8. The interior space of the vacuum partition 50 is evacuated. The outside of the vacuum partition 50 is atmosphere. The vacuum partition 50 is made, for example, of stainless steel.

In the multipole lens 100, the vacuum partition 50 is disposed between the base portion 11b and the front end portion 13b and so the front end portions 13a, 13b, and 13c can be placed in an evacuated space, while the base portions 11a, 11b, and 11c can be placed outside a vacuum. As a consequence, in the multipole lens 100, electric discharges from the front end portions 13a, 13b, and 13c can be avoided. Furthermore, the coils 16a, 16b, 16c, 18a, 18b, and 18c which tend to cause vacuum deterioration can be placed outside a vacuum. Additionally, in the multipole lens 100, the region that is evacuated can be reduced as compared with the case where the polar elements of the multipole lens are totally placed inside a vacuum partition. As a result, the electron microscope can achieve a higher degree of vacuum. The multipole lens 100 can be suppressed from deteriorating the degrees of vacuum in the electron optical column and in the sample chamber.

In the multipole lens 100, the magnetic field separator 20 is in contact with the front end portions 13a and 13b that are adjacent to each other in the direction of stacking of the lens subassemblies 10a, 10b, and 10c. The magnetic field separator 22 is in contact with the front end portions 13b and 13c which are adjacent to each other in the direction of stacking of the lens subassemblies 10a, 10b, and 10c. Therefore, the magnetic field separators 20 and 22 can support the front end portions 13a, 13b, and 13c. Because the magnetic field separators 20 and 22 have electrical conductivity and are in contact with the front end portions 13a, 13b, and 13c which are successively adjacent to each other in the direction of stacking of the lens subassemblies 10a, 10b, and 10c, the front end portions 13a, 13b, and 13c can be made equipotential.

In the multipole lens 100, the first support portion 30 is mounted between the base portions 11a and 11b which are adjacent to each other in the direction of stacking of the lens subassemblies 10a, 10b, and 10c. The first support portion 32 is mounted between the base portions 11b and 11c that are adjacent to each other in the direction of stacking of the lens subassemblies 10a, 10b, and 10c. Consequently, the base portions 11a, 11 b, and 11c can be supported while being magnetically isolated from each other.

In the multipole lens 100, the second support portion 40 is mounted between the yokes 14a and 14b which are adjacent to each other in the direction of stacking of the lens subassemblies 10a, 10b, and 10c. The second support portion 42 is mounted between the yokes 14b and 14c which are adjacent to each other in the direction of stacking of the lens subassemblies 10a, 10b, and 10c. As a consequence, the yokes 14a, 14b, and 14c can be supported while being magnetically isolated from each other.

The multipole lens 100 includes the first coils 16a, 16b, and 16c mounted on the base portions 11a, 11b, and 11c and the second coils 18a, 18b, 18c mounted also on the base portions 11a, 11b, and 11c. Each of the second coils 18a, 18b, and 18c has a fewer number of turns than each of the first coils 16a, 16b, and 16c. Therefore, main static magnetic fields can be produced by the first coils 16a, 16b, and 16c. Adjustive static magnetic fields can be produced by the second coils 18a, 18b, and 18c.

2. Chromatic Aberration Corrector 2.1. Configuration of Chromatic Aberration Corrector A chromatic aberration corrector associated with one embodiment of the invention is next described by referring to FIG. 9. This chromatic aberration corrector is adapted for use with an electron microscope that is a microscope which irradiates a sample under investigation with an electron beam and produces a magnified image of the sample. Examples of electron microscope include transmission electron microscope (TEM), scanning transmission electron microscope (STEM), and scanning electron microscope (STEM).

Figure 9:
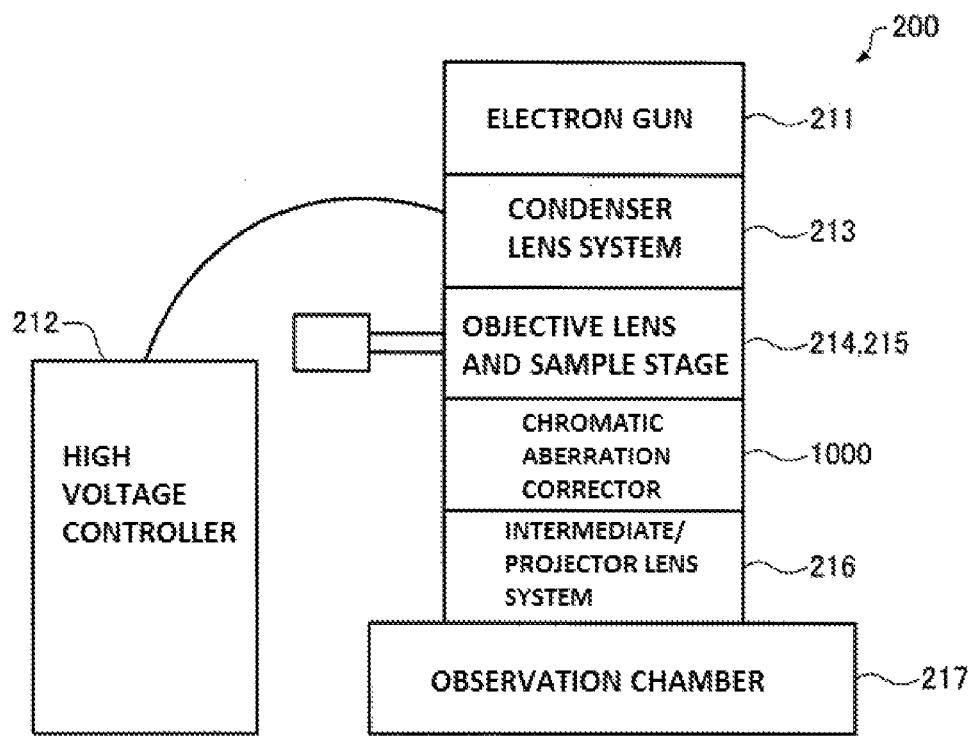
FIG. 9 is a block diagram of an electron microscope equipped with a chromatic aberration corrector associated with one embodiment of the present invention.

FIG. 9 shows the configuration of an electron microscope 200 equipped with a chromatic aberration corrector 1000 associated with the present embodiment. A case in which the chromatic aberration corrector 1000 is installed in a transmission electron microscope is described. That is, the chromatic aberration corrector 1000 is adapted for use with a transmission electron microscope.

The electron microscope 200 is configured including an electron gun 211, a high voltage controller 212, a condenser lens system 213, an objective lens 214, a sample stage 215, the chromatic aberration corrector 1000, an intermediate/ projector lens system 216, and an observation chamber 217. In the electron microscope 200, the chromatic aberration corrector 1000 is used as an aberration corrector for the imaging system.

The electron gun 211 whose high voltage source is controlled by the high voltage controller 212 produces an electron beam. The condenser lens system 213 focuses the electron beam produced by the electron gun 211. The beam focused by the condenser lens system 213 reaches the objective lens 214 and the sample stage 215. The condenser lens system 213 constitutes an illumination lens system for illuminating a sample on the sample stage 215 with the electron beam.

The objective lens 214 is an initial stage of lens for imaging the electron beam transmitted through the sample. The sample stage 215 holds the sample thereon. The electron beam transmitted through the sample enters the chromatic aberration corrector 1000. Objective minilenses 220 and 222 (see FIG. 10) may be positioned between the objective lens 214 and the chromatic aberration corrector 1000.

The chromatic aberration corrector 1000 corrects chromatic aberration in the objective lens 214. The chromatic aberration corrector 1000 includes a multipole lens associated with the present invention. An example in which the chromatic aberration corrector 1000 includes the above-described multipole lens 100 as a multipole lens associated with the present invention is given below. The multipole lens 100 is incorporated in the electron microscope 200 such that the vacuum partition 50 is disposed between the base portion 11*b* and the front end portion 13*b* as shown in FIGS. 7 and 8. The electron beam which has been corrected for spherical aberration by the chromatic aberration corrector 1000 reaches the intermediate/projector lens system 216. Details of the chromatic aberration corrector 1000 will be described later.

The intermediate/projector lens system 216 cooperates with the objective lens 214 to constitute an imaging lens system for causing the electron beam transmitted through the sample to be imaged onto a camera (not shown) installed inside the observation chamber 217.

The electron microscope 200 can correct the imaging system including the objective lens 214 for chromatic aberration because the chromatic aberration corrector 1000 is included. Consequently, the electron microscope 200 can provide high resolution.

Figure 10:
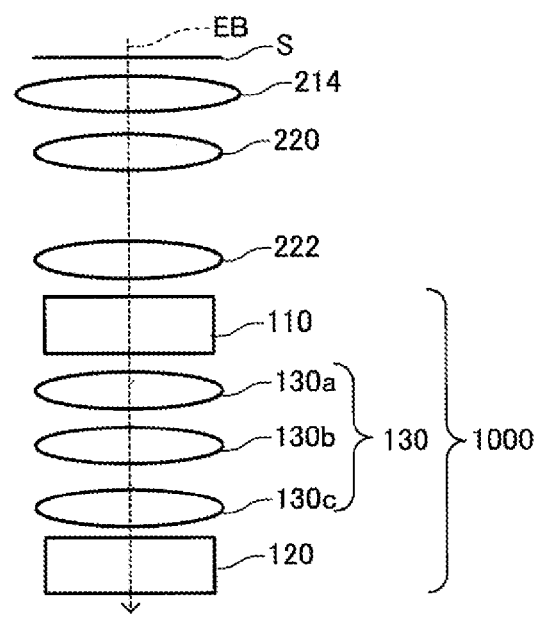
FIG. 10 is an optical ray diagram of the optical system of the chromatic aberration corrector shown in FIG. 9.

FIG. 10 shows the optical system of the chromatic aberration corrector 1000. As shown in this figure, the electron beam EB transmitted through the sample S passes through the objective lens 214 and objective minilenses 220, 222 and enters the chromatic aberration corrector 1000. The objective minilenses 220 and 222 cooperate with the objective lens 214 and intermediate/projector lens system 216 to constitute an imaging system.

The chromatic aberration corrector 1000 is located behind the objective lens 214 including the objective minilenses 220 and 222. The chromatic aberration corrector 1000 includes a first multipole element 110 and a second multipole element 120. The multipole lens 100 can be used as each of the multipole elements 110 and 120. The chromatic aberration corrector 1000 can further include a transfer lens 130.

In the chromatic aberration corrector 1000, the first multipole element 110, transfer lens 130, and second multipole lens 120 are arranged in this order from the upstream side relative to the direction of the electron beam EB. The beam EB enters the first multipole element 110, passes through the transfer lens 130, and exits from the second multipole lens 120.

Figure 11A:
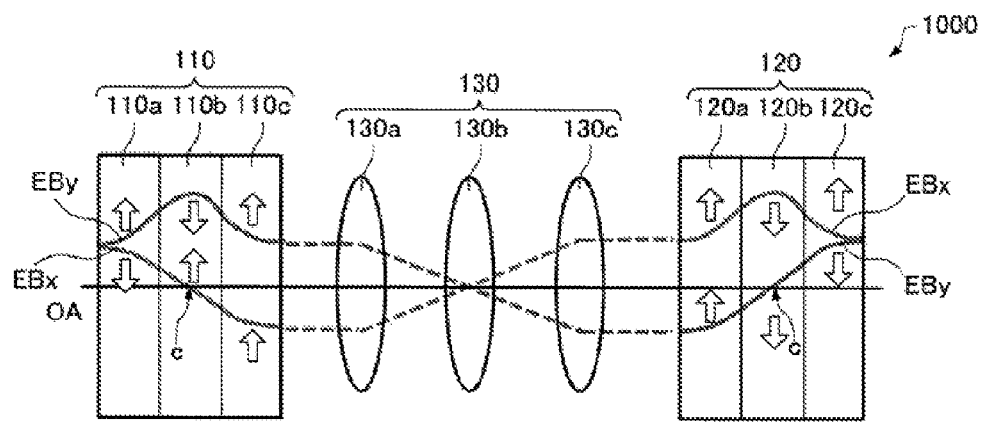
FIG. 11A is a diagram illustrating the configuration of the chromatic aberration corrector shown in FIG. 9.
Figure 11B:
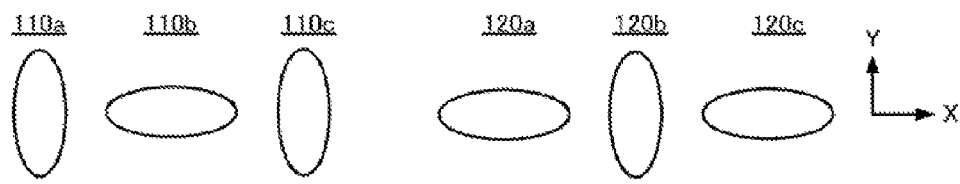
FIG. 11B is a diagram illustrating two-fold astigmatism components in various parts of the chromatic aberration corrector shown in FIG. 9.
Figure 11C:
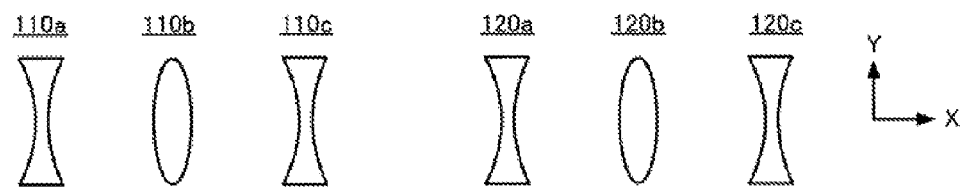
FIG. 11C is a diagram illustrating lens effects produced by various portions of the chromatic aberration corrector shown in FIGS. 9 and 11A.
Figure 11D:
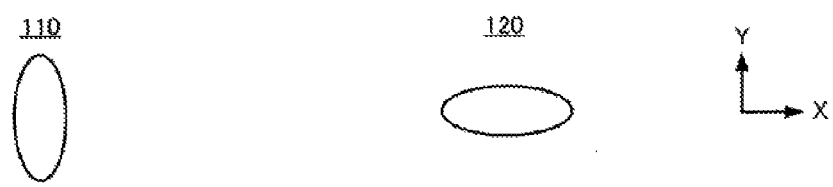
FIG. 11D is a diagram illustrating two-fold chromatic astigmatism components produced by first and second multipole elements, respectively, of the chromatic aberration corrector shown in FIGS. 9 and 11A.

FIGS. 11A-11D illustrate the first multipole element 110 and the second multipole element 120 of the chromatic aberration corrector 1000. FIG. 11A shows the configuration of the chromatic aberration corrector 1000. In FIG. 11A, an X orbit EBx is shown as a typical orbit of the electron beam EB in the X-axis direction. A Y orbit EBy is shown as a typical orbit of the beam EB in the Y-axis direction. The X- and Y-axes are vertical to the optical axis OA and perpendicular to each other. FIG. 11B illustrates two-fold astigmatism components in portions 110*a*, 110*b*, 110*c*, 120*a*, 120*b*, and 120*c* of the multipole elements 110 and 120. FIG. 11C illustrates lens effects produced by the portions 110*a*, 110*b*, 110*c*, 120*a*, 120*b*, and 120*c* of the multipole elements 110 and 120. FIG. 11D illustrates two-fold astigmatism components produced in the first multipole element 110 and second multipole element 120.

As shown in FIG. 11A, the first multipole element 110 is divided into first, second, and third stages (first, second, and third portions) 110*a*, 110*b*, and 110*c* along the optical axis OA. The first portion 110*a* of the first multipole element 110 corresponds to the first lens subassembly 10*a* shown in FIGS. 1-4. The second portion 110*b* of the first multipole element 110 corresponds to the second lens subassembly 10*b*. The third portion 110*c* of the first multipole element 110 corresponds to the third lens subassembly 10*c*. The electron beam EB enters the first portion 110*a*, passes through the second portion 110*b*, and exits from the third portion 110*c*.

The first multipole element 110 produces a first electromagnetic field. Each of the three portions 110*a*, 110*b*, and 110*c* of the first multipole element 110 produces a quadrupolar field of superimposed electric and magnetic fields (electromagnetic field of two-fold symmetry) by superimposing a quadrupolar electric field of two-fold symmetry and a quadrupolar magnetic field of two-fold symmetry. The first electromagnetic field is produced by the quadrupolar fields of superimposed electric and magnetic fields generated by the three portions 110*a*, 110*b*, and 110*c* of the first multipole element 110, the three portions 110*a*-110*c* being arrayed along the optical axis OA.

Figure 12:
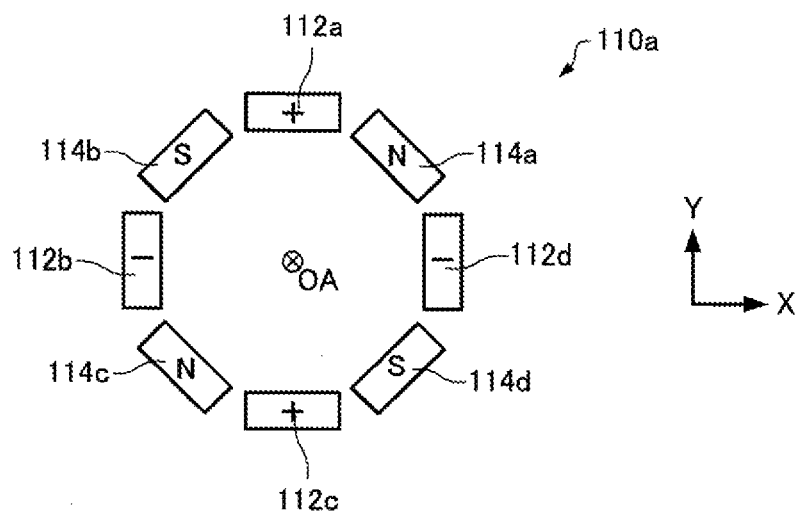
FIG. 12 is a schematic plan view of a first portion of a first multipole element of the chromatic aberration corrector shown in FIGS. 9 and 11A.

The three portions 110*a*, 110*b*, and 110*c* of the first multipole element 110 are described in detail below. The first portion (first stage) 110*a* of the first multipole element 110 is first described. FIG. 12 is a schematic plan view of the first portion 110*a* of the first multipole element 110. The first portion 110*a* of the first multipole element 110 has plural electrodes and plural magnetic poles arranged regularly around the optical axis OA. In the illustrated example, the first portion 110*a* has quadrupolar electrodes 112*a*-112*d* and quadrupolar magnetic poles 114*a*-114*d* arranged around the optical axis OA.

The electrodes 112*a*-112*d* are angularly spaced from each other by 90 degrees in an X-Y plane perpendicular to the optical axis OA. Voltages applied to the electrodes 112*a*-112*d* are equal in absolute value but alternate only in polarity. The quadrupolar electrodes 112*a*-112*d* produce a quadrupolar electric field.

The magnetic poles 114*a*-114*d* are angularly spaced from each other by 90 degrees within the X-Y plane perpendicular to the optical axis OA. The magnetic poles 114a-114d produce electromotive forces of equal magnitude but alternate only in polarity. The quadrupolar magnetic poles 114a-114d produce a quadrupolar magnetic field.

In the first portion 110a of the first multipole element 110, the 12 polar elements 12a of the first lens subassembly 10a of the multipole lens 100 shown in FIG. 1 are used as the electrodes 112a-112d and magnetic poles 114a-114d shown in FIG. 12. That is, a quadrupolar electric field and a quadrupolar magnetic field are produced by the 12 polar elements 12a of the first lens subassembly 10a to thereby produce a quadrupolar field of superimposed electric and magnetic fields.

Figure 13:
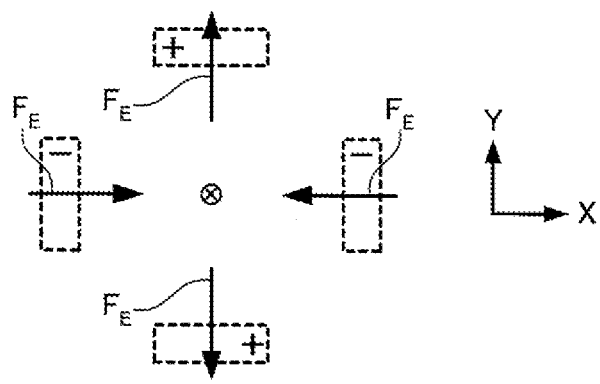
FIG. 13 is a diagram illustrating forces that an electron beam undergoes from a quadrupolar electric field produced by quadrupolar electrodes.

FIG. 13 illustrates the forces that the electron beam EB undergoes from the quadrupolar electric field produced by the quadrupolar electrodes 112a-112d. As shown in FIG. 13, the quadrupolar electric field produced by the quadrupolar electrodes 112a-112d has a converging action in the X-axis direction on the electron beam EB and a diverging action in the Y-axis direction. Accordingly, the electron beam EB undergoes force $F_E$ from the quadrupolar electric field and thus converges in the X-axis direction and diverges in the Y-axis direction.

Figure 14:
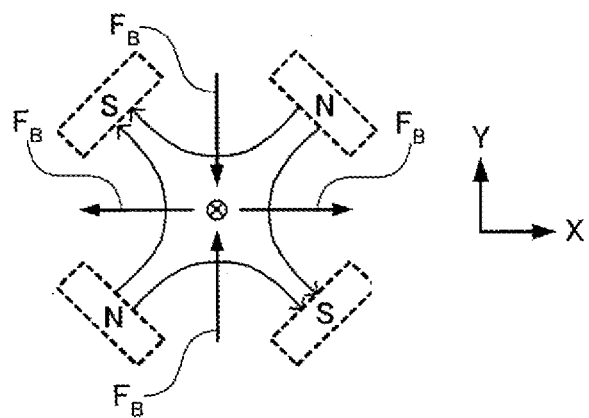
FIG. 14 is a diagram illustrating forces that an electron beam undergoes from a quadrupolar magnetic field produced by a magnetic quadrupole.

FIG. 14 is a diagram illustrating the forces that the electron beam EB undergoes from the quadrupolar magnetic field produced by the quadrupolar magnetic poles 114a-114d. As shown in this figure, the quadrupolar magnetic field generated by the quadrupolar magnetic poles 114a-114d produces a diverging action in the X-axis direction on the beam EB and a converging action in the Y-axis direction. Since the beam EB undergoes the force $F_B$ from the quadrupolar magnetic field, the beam diverges in the X-axis direction and converges in the Y-axis direction.

In the first portion 110a, the quadrupolar electric field and quadrupolar magnetic field are superimposed to produce a quadrupolar field of superimposed electric and magnetic fields. As described above, in the first portion 110a, the force $F_E$ that the electron beam EB undergoes from the quadrupolar electric field and the force $F_B$ that the beam EB undergoes from the quadrupolar magnetic field are applied in such directions that the forces cancel out each other.

In the first portion 110a, the quadrupolar electric field is set stronger than the quadrupolar magnetic field. In particular, in the first portion 110a, the force $F_E$ that the electron beam EB undergoes from the quadrupolar electric field is set stronger than the force $F_B$ that the beam EB undergoes from the quadrupolar magnetic field ($F_B < F_E$). This gives a two-fold astigmatism component to the beam EB and varies the orbit. More specifically, as illustrated in FIGS. 11A and 11B, the first portion 110a gives a diverging component of two-fold astigmatism to the Y orbit EBy of the beam EB and a converging component of two-fold astigmatism to the X orbit EBx of the beam EB.

The first portion 110a has a thickness in the direction of travel of the electron beam EB. In particular, the first portion 110a has a thickness producing combination aberrations due to higher-order terms other than the primary term of the multipolar field. Therefore, in the first portion 110a, negative chromatic aberration is produced by the combination aberrations. Furthermore, the first portion 110a produces a concave lens action on the beam EB owing to the combination aberrations as shown in FIG. 11C. That is, the first portion 110a exerts a concave lens action on the beam EB according to a principle, which will be described later.

The combination aberrations referred to herein are produced by a combination of aberrations one and two when aberration one is produced at some location and propagates some distance to thereby vary the point of incidence and become affected by other aberration two.

The second portion (second stage) 110b of the first multipole element 110 is next described. The second portion 110b is similar in configuration to the first portion 110a shown in FIG. 12. That is, the second portion 110b of the first multipole element 110 has quadrupolar electrodes 112a-112d and quadrupolar magnetic poles 114a-114d arranged around the optical axis OA.

In the second portion 110b of the first multipole element 110, the 12 polar elements 12b of the second lens subassembly 10b of the multipole lens 100 are used as the electrodes 112a-112d and magnetic poles 114a-114d. That is, a quadrupolar electric field and a quadrupolar magnetic field are produced by the 12 polar elements 12b of the second lens subassembly 10b, thus producing a quadrupolar field of superimposed electric and magnetic fields.

In the second portion 110b, the quadrupolar magnetic field is set stronger than the quadrupolar electric field. That is, in the second portion 110b, the force $F_B$ that the electron beam EB undergoes from the quadrupolar magnetic field is set stronger than the force $F_E$ that the beam EB undergoes from the quadrupolar electric field ($F_E < F_B$). Consequently, the second portion 110b produces a two-fold astigmatism component that is opposite in sign to the two-fold astigmatism component produced by the first portion 110a. That is, the second portion 110b applies a quadrupolar electric field that is opposite in sense to the field given by the first portion 110a to the electron beam. More specifically, the second portion 110b produces a quadrupolar field that gives a converging component of two-fold astigmatism to the Y orbit EBy of the electron beam EB and a diverging component of two-fold astigmatism to the X orbit EBx of the beam EB as illustrated in FIGS. 11A and 11B. Consequently, as illustrated in FIG. 11A, the second portion 110b pushes back the Y orbit EBy having a divergent component to thereby reduce its two-fold astigmatism component and to weaken the converging component of two-fold astigmatism of the X orbit EBx.

Furthermore, the second portion 110b has a thickness in the direction of travel of the electron beam EB in the same way as the first portion 110a. Therefore, in the second portion 110b, negative chromatic aberration is produced due to combination aberrations. The second portion 110b produces a convex lens action on the beam EB by the combination aberrations as shown in FIG. 11C. That is, the second portion 110b exerts a convex lens action on the electron beam EB.

The third portion (third stage) 110c of the first multipole element 110 is next described. The third portion 110c is similar in configuration to the first portion 110a shown in FIG. 12. That is, the third portion 110c of the first multipole element 110 has quadrupolar electrodes 112a-112d and quadrupolar magnetic poles 114a-114d arranged around the optical axis OA.

In the third portion 110c of the first multipole element 110, the 12 polar elements 12c of the third lens subassembly 10c of the multipole lens 100 are used as the electrodes 112a-112d and magnetic poles 114a-114d. That is, a quadrupolar electric field and a quadrupolar magnetic field are produced by the 12 polar elements 12c of the third lens subassembly 10c. As a result, a quadrupolar field of superimposed electric and magnetic fields is generated.

In the third portion 110c, the quadrupolar electric field is set stronger than the quadrupolar magnetic field in the same way as in the first portion 110a. That is, in the third portion 110c, the force $F_E$ that the electron beam EB undergoes from the quadrupolar electric field is set stronger than the force $F_B$ that the beam EB undergoes from the quadrupolar magnetic field ($F_B < F_E$). Consequently, the third portion 110c imparts a two-fold astigmatism component to the beam EB to thereby vary the orbit in the same way as the first portion 110a. More specifically, the third portion 110c gives a diverging component of two-fold astigmatism to the Y orbit EBy of the beam EB and a converging component of two-fold astigmatism to the X orbit EBx of the beam EB as shown in FIGS. 11A and 11B. As a consequence, the two-fold astigmatism component in the electron beam EB exiting from the first multipole element 110 can be eliminated or reduced.

The third portion 110c has a thickness in the direction of travel of the electron beam EB in the same way as the first portion 110a. Therefore, in the third portion 110c, negative chromatic aberration is produced due to combination aberrations. The third portion 110c produces a concave lens action on the electron beam due to the combination aberrations as shown in FIG. 11C. That is, the third portion 110c has a concave lens action on the electron beam EB.

The two-fold astigmatism component of the quadrupolar field of superimposed electric and magnetic fields produced by the first portion 110a and third portion 110c of the first multipolar element 110 is opposite in sign to the two-fold astigmatism component of the quadrupolar field of superimposed electric and magnetic fields produced by the second portion 110b. In the illustrated example, the quadrupolar field of superimposed electric and magnetic fields produced in the first portion 110a is the same as the quadrupolar field of superimposed electric and magnetic fields produced by the third portion 110c. That is, the action exerted on the electron beam by the quadrupolar field of superimposed electric and magnetic fields of the first portion 110a is the same as the action exerted on the beam by the quadrupolar field of superimposed electric and magnetic fields of the third portion 110c.

In the first multipole element 110, the X orbit EBx of the electron beam EB intersects the optical axis OA at the center c of the first multipole element 110 as shown in FIG. 11A. Also, in the first multipole element 110, the former half of the X orbit EBx of the electron beam EB from the incident plane to the center c and the latter half of the orbit from the center c to the exit plane exhibit point symmetry with respect to the center c. Furthermore, in the first multipole element 110, the former half of the Y orbit EBy of the beam EB from the plane of incidence to the center c and the latter half of the orbit from the center c to the exit plane exhibit plane symmetry. In this way, in the first multipole element 110, the orbit of the electron beam EB exhibits good symmetrical properties.

Furthermore, in the first multipole lens 110, the orbits EBx and EBy of the electron beam EB are varied greatly in the first portion 110a, then are returned to their original orbits in the second portion 110b, and finally the two-fold astigmatism component is canceled in the third portion 110c and the beam EB is made to exit as shown in FIG. 11A. In this way, in the first multipole element 110, the orbits EBx and EBy of the beam are varied greatly and so chromatic aberration is produced at high efficiency.

In the first multipole element 110, the aforementioned first electromagnetic field is produced by setting the strength of the quadrupolar electric field uniform for all the portions 110a, 110b, and 110c and setting the quadrupolar magnetic field in the first and third portions 110a, 110c stronger than the quadrupolar magnetic field in the second portion 110b.

In the multipole lens 100 used as the first multipole element 110, the front end portions 13a, 13b, and 13c that are successively adjacent to each other in the direction of stacking of the lens subassemblies 10a, 10b, and 10c are connected by the conductive magnetic field separators 20 and 22 as shown in FIGS. 2-4 and thus are equipotential. Therefore, the quadrupolar electric field can be made uniform in strength across the portions 110a, 110b, and 110c. In addition, in the multipole lens 100, the front end portions 13a, 13b, and 13c are successively separated from one another by the magnetic field separators 20 and 22 made of a nonmagnetic material. Consequently, it is possible to produce a quadrupolar magnetic field showing a strength that is different among the portions 110a, 110b, and 110c.

The second multipole element 120 produces a second electromagnetic field that is angularly shifted from the first electromagnetic field by 90 degrees about the optical axis OA. That is, in the second multipole element 120, as shown in FIG. 11A, electric and magnetic fields are so set that the X orbit EBx and Y orbit EBy are symmetrical with respect to the first multipole element 110. Consequently, as shown in FIG. 11D, a two-fold astigmatism component produced in the first multipole element 110 can be canceled out by the two-fold astigmatism component produced in the second multipole element 120. Thus, in the whole chromatic aberration corrector 1000, the two-fold chromatic astigmatism component can be removed.

As shown in FIG. 11A, the second multipole element 120 is divided into three portions (first portion (first stage) 120a, second portion (second stage) 120b, and third portion (third stage) 120c) along the optical axis OA. The first portion 120a of the second multipole element 120 corresponds to the first lens subassembly 10a shown in FIGS. 1-4, the second portion 120b corresponds to the second lens subassembly 10b, and the third portion 120c corresponds to the third lens subassembly 10c. In the second multipole element 120, the electron beam EB enters the first portion 120a, passes through the second portion 120b, and exits from the third portion 120c. Each of the three portions 120a, 120b, and 120c of the second multipole element 120 produces a quadrupolar field of superimposed electric and magnetic fields by superimposing a quadrupolar electric field and a quadrupolar magnetic field. The quadrupolar field of superimposed electric and magnetic fields produced by the three portions 120a, 120b, and 120c of the second multipole element 120 produces the second electromagnetic field. That is, the second electromagnetic field is created by the quadrupolar field of superimposed electric and magnetic fields produced by the portions 120a, 120b, and 120c arrayed along the optical axis OA.

Figure 15:
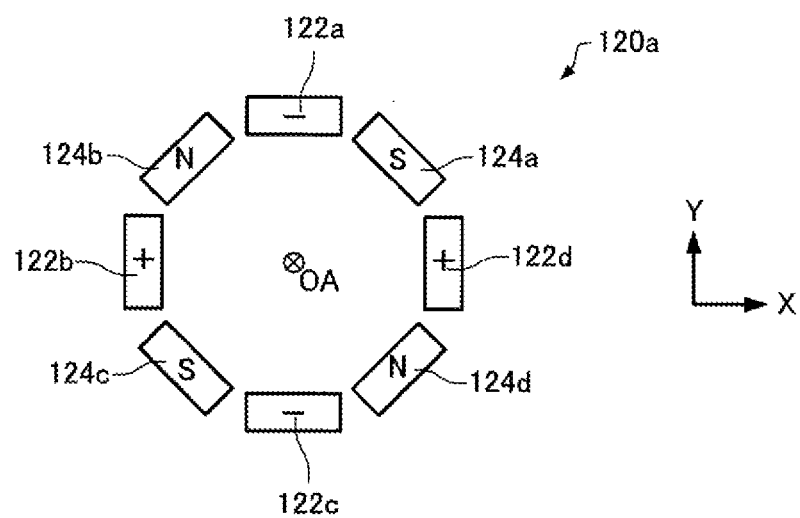
FIG. 15 is a schematic plan view of a first portion of a second multipole element of the chromatic aberration corrector shown in FIGS. 9 and 11A.

The three portions 120a, 120b, and 120c of the second multipole element 120 are hereinafter described in detail. The first portion (first stage) 120a of the second multipole element 120 is first described. FIG. 15 is a schematic plan view of the first portion 120a of the second multipole element 120. The first portion 120a of the second multipole element 120 has plural electrodes and plural magnetic poles arranged regularly around the optical axis OA. In the illustrated example, the first portion 120a of the second multipole element 120 has quadrupolar electrodes 122a-122d and quadrupolar magnetic poles 124a-124d arranged around the optical axis OA.

The electrodes 122a-122d are angularly spaced from each other by 90 degrees within the X-Y plane perpendicular to the optical axis OA. Voltages applied to the electrodes 122a-122d are equal in absolute value but alternate only in polarity. The quadrupolar electrodes 122a-122d produce a quadrupolar electric field.

The magnetic poles 124a-124d are angularly spaced from each other at intervals of 90 degrees within the X-Y plane perpendicular to the optical axis OA. The electromotive forces produced by the magnetic poles 124a-124d are equal in magnitude but alternate only in polarity. The quadrupolar magnetic poles 124a-124d produce a quadrupolar magnetic field.

The physical arrangement of the poles 122a-122d and 124a-124d of the first portion 120a of the second multipole element 120 is similar to that in the first portion 110a (see FIG. 12) of the first multipole element 110 but the polarities are reversed as shown in FIG. 15. That is, the polarities of the second multipole element 120 are rotated through 90 degrees with respect to the polarities of the first multipole element 110.

In the first portion 120a of the second multipole element 120, the 12 polar elements 12a of the first lens subassembly 10a of the multipole lens 100 shown in FIG. 1 are used as the electrodes 122a-122d and magnetic poles 124a-124d. That is, a quadrupolar electric field and a quadrupolar magnetic field are produced by the 12, polar elements 12a of the first lens subassembly 10a, thus producing a quadrupolar field of superimposed electric and magnetic fields.

In the first portion 120a, the quadrupolar electric field is set stronger than the quadrupolar magnetic field. That is, in the first portion 120a, the force $F_E$ that the electron beam EB undergoes from the quadrupolar electric field is set stronger than the force $F_B$ that the beam EB undergoes from the quadrupolar magnetic field ($F_B<F_E$). This imparts a two-fold astigmatism component to the beam EB and varies the orbit. More specifically, the first portion 120a gives a diverging component of two-fold astigmatism to the X orbit EBx of the electron beam EB and a converging component of two-fold astigmatism to the Y orbit EBy of the beam EB as shown in FIGS. 11A and 11B. The quadrupolar field of superimposed electric and magnetic fields produced by the first portion 120a of the second multipole element 120 is angularly shifted by 90 degrees about the optical axis OA with respect to the quadrupolar field of superimposed electric and magnetic fields produced by the first portion 110a of the first multipole element 110.

The first portion 120a has a thickness in the direction of travel of the electron beam EB. In particular, the first portion 120a has a thickness producing combination aberrations due to higher-order fields other than the primary terms of the multipolar field. Therefore, in the first portion 120a, negative chromatic aberration is produced by combination aberrations. The first portion 120a produces a concave lens action on the electron beam due to the combination aberrations. That is, the first portion 120a has a concave lens action on the electron beam EB.

The second portion (second stage) 120b of the second multipole element 120 is next described. The second portion 120b is similar in configuration to the first portion 120a shown in FIG. 15. That is, the second portion 120b of the second multipole element 120 has quadrupolar electrodes 122a-122d and quadrupolar magnetic poles 124a-124d arranged around the optical axis OA.

In the second portion 120b of the second multipole element 120, the 12 polar elements 12b of the second lens subassembly 10b of the multipole lens 100 are used as the electrodes 122a-122d and magnetic poles 124a-124d. That is, a quadrupolar electric field and a quadrupolar magnetic field are produced by the 12 polar elements 12b of the second lens subassembly 10b, thus producing a quadrupolar field of superimposed electric and magnetic fields.

In the second portion 120b, the quadrupolar magnetic field is set stronger than the quadrupolar electric field. That is, in the second portion 120b, the force $F_B$ that the electron beam EB undergoes from the quadrupolar magnetic field is set stronger than the force $F_E$ that the beam EB undergoes from the quadrupolar electric field ($F_E<F_B$). Consequently, the second portion 120b produces a two-fold astigmatism component that is opposite in sign to the two-fold astigmatism component produced by the first portion 120a. That is, in the second portion 120b, a quadrupolar field opposite in sense to the field in the first portion 120a is given to the electron beam. More specifically, the second portion 120b produces a quadrupolar field which gives a converging component of two-fold astigmatism to the X orbit EBx of the beam EB and which gives a diverging component of two-fold astigmatism to the Y orbit EBy of the beam EB as shown in FIGS. 11A and 11B. Consequently, the second portion 120b pushes back the X orbit EBx having the diverging component to thereby reduce the two-fold astigmatism component and to weaken the converging component of the two-fold astigmatism of the Y orbit EBy as shown in FIG. 11A. The quadrupolar field of superimposed electric and magnetic fields produced by the second portion 120b of the second multipole element 120 is angularly shifted by 90 degrees about the optical axis OA with respect to the quadrupolar field of superimposed electric and magnetic fields produced by the second portion 110b of the first multipole element 110.

The second portion 120b has a thickness in the direction of travel of the electron beam EB in the same way as the first portion 120a. Therefore, in the second portion 120b, negative chromatic aberration is produced by combination aberrations. Furthermore, the second portion 120b produces a convex lens action on the electron beam EB owing to the combination aberrations as shown in FIG. 11C. That is, the second portion 120b has a convex lens action on the beam EB.

The third portion (third stage) 120c of the second multipole element 120 is next described. The third portion 120c is similar in configuration to the first portion 120a shown in FIG. 15. That is, the third portion 120c of the second multipole element 120 has quadrupolar electrodes 122a-122d and quadrupolar magnetic poles 124a-124d arranged around the optical axis OA.

In the third portion 110c of the second multipole element 120, the 12 polar elements 12c of the third lens subassembly 10c of the multipole lens 100 are used as the electrodes 122a-122d and magnetic poles 124a-124d. That is, a quadrupolar electric field and a quadrupolar magnetic field are produced by the 12 polar elements 12c of the third lens subassembly 10c, thus producing a quadrupolar field of superimposed electric and magnetic fields.

In the third portion 120c, the quadrupolar electric field is set stronger than the quadrupolar magnetic field in the same way as in the first portion 120a. That is, in the third portion 120c, the force $F_E$ that the electron beam EB undergoes from the quadrupolar electric field is set stronger than the force $F_B$ that the beam EB undergoes from the quadrupolar magnetic field ($F_B<F_E$). This gives a two-fold astigmatism component to the beam EB and varies the orbit in the same way as for the first portion 120a. More specifically, the third portion 120c gives a diverging component of two-fold astigmatism to the X orbit EBx of the electron beam EB and gives a converging component of two-fold astigmatism to the Y orbit EBy of the beam EB. Consequently, the two-fold astigmatism component in the electron beam EB exiting from the second multipole element 120 can be removed or reduced. The quadrupolar field of superimposed electric and magnetic fields produced by the third portion 120c of the second multipole element 120 is angularly shifted by 90 degrees about the optical axis OA with respect to the quadrupolar field of superimposed electric and magnetic fields produced by the third portion 110c of the first multipole element 110.

The third portion 120c has a thickness in the direction of travel of the electron beam EB in the same way as the first portion 120a. Therefore, in the third portion 120c, negative chromatic aberration is produced by combination aberrations. Furthermore, the third portion 120c produces a concave lens action on the beam owing to the combination aberrations. That is, the third portion 120c has a concave lens action on the beam EB.

In the second multipole element 120, the two-fold astigmatism component in the quadrupolar field of superimposed electric and magnetic fields produced by the first portion 120a and third portion 120c is opposite in sign to the two-fold astigmatism component in the quadrupolar field of superimposed electric and magnetic fields produced by the second portion 120b. In the illustrated example, the quadrupolar field of superimposed electric and magnetic fields produced by the first portion 120a is the same as the quadrupolar field of superimposed electric and magnetic fields produced by the third portion 120c. That is, the action exerted on the electron beam by the quadrupolar field of superimposed electric and magnetic fields produced by the first portion 120a is the same as the action exerted on the beam by the quadrupolar field of superimposed electric and magnetic fields produced by the third portion 120c.

In the second multipole element 120, the Y orbit EBy of the electron beam EB intersects the optical axis OA at the center c of the second multipole element 120 as shown in FIG. 11A. In the second multipole element 120, the former half of the X orbit EBx of the electron beam EB from the incident plane to the center c and the latter half from the center c to the exit plane exhibit point symmetry with respect to the center c. Furthermore, in the second multipole element 120, the former half of the X orbit EBx of the beam EB from the plane of incidence to the center c and the latter half from the center c to the exit plane exhibit plane symmetry. In this way, in the second multipole element 120, the orbit of the electron beam EB exhibits good symmetry.

Furthermore, in the second multipole lens 120, the orbits EBx and EBy of the electron beam EB are varied greatly in the first portion 120a, then are returned to their original orbits in the second portion 120b, and finally the two-fold astigmatism component is canceled in the third portion 120c and the beam EB is made to exit as shown in FIG. 11A. In this way, in the second multipole element 120, the orbits EBx and EBy of the beam are varied greatly and so chromatic aberration is produced at high efficiency.

In the second multipole element 120, the aforementioned second electromagnetic field is produced by setting the strength of the quadrupolar electric field uniform for all the portions 110a, 110b, and 110c and setting the quadrupolar magnetic field in the second portion 110b stronger than in the first and third portions 110a and 110c in the same way as in the first multipole element 110.

In the multipole lens 100 used as the second multipole element 120, the front end portions 13a, 13b, and 13c are successively connected by the conductive magnetic field separators 20 and 22 as shown in FIGS. 2-4 and, therefore, these front end portions are equipotential. Consequently, the quadrupolar electric field can be made uniform in strength among the portions 120a, 120b, and 120c. In the multipole lens 100, the front end portions 13a, 13b, and 13c are separated from each other by the magnetic field separators 20 and 22 made of a nonmagnetic material and so quadrupolar magnetic fields of different magnitudes can be produced by the portions 120a, 120b, and 120c.

The transfer lens 130 is disposed between the first multipole lens 110 and the second multipole lens 120. In the illustrated example, the transfer lens 130 is made up of three lens elements 130a, 130b, and 130c. For example, the transfer lens 130 is a lens having a transfer magnification of 1:1. The transfer lens 130 operates to transfer a reciprocal space image formed in the first multipole element 110 to the second multipole element 120. The transfer lens 130 is so arranged that the center of the first multipole element 110 is not perfectly transferred to the center of the second multipole element 120 such that there is no two-fold astigmatism component at the exit (exit plane) of the second multipole element 120. The transfer lens 130 may be made of a pair of lens elements in an unillustrated manner.

2.2. Operation of Chromatic Aberration Corrector

Figure 16:
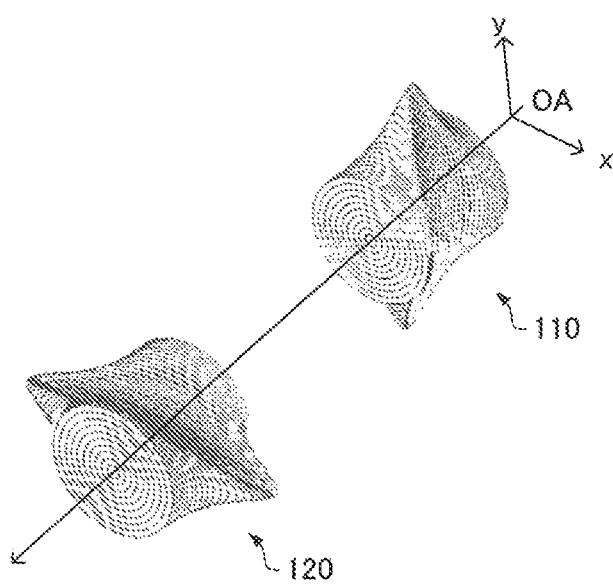
FIG. 16 is a schematic diagram illustrating the orbits of an electron beam in the first and second multipole elements of the chromatic aberration corrector shown in FIGS. 9 and 11A.

The operation of the chromatic aberration corrector 1000 associated with the present embodiment is next described by referring to FIGS. 11A-11D and 16. FIG. 16 schematically shows the orbit of an electron beam within the first multipole element 110 and within the second multipole element 120 of the corrector 1000. In FIG. 16, each circle indicates the orbit of the electron beam in angular steps of 10 mrad.

In the first portion 110a of the first multipole element 110, the quadrupolar electric field is set stronger than the quadrupolar magnetic field. Consequently, a two-fold astigmatism component is imparted to the electron beam EB entering the first portion 110a, varying the orbit. Specifically, the Y orbit EBy of the beam EB has a diverging component of two-fold astigmatism and the X orbit EBx has a converging component of two-fold astigmatism in the first portion 110a.

In the second portion 110b, the quadrupolar magnetic field is set stronger than the quadrupolar electric field. Therefore, in the second portion 110b, the Y orbit EBy having a diverging component is pushed back and the two-fold astigmatism component decreases. In the X orbit EBx, the converging component of the two-fold astigmatism component weakens, and the X orbit EBx passes through the center c of the first multipole element 110. In the X orbit EBx, the orbit on the positive side of the X-axis and the orbit on the negative side of the X-axis intersect with each other at the center c of the first multipole element 110 as shown in FIGS. 11A and 16.

In the third portion 110c, the quadrupolar electric field is set stronger than the quadrupolar magnetic field. Consequently, in the third portion 110c, the two-fold astigmatism component in the electron beam EB is finally canceled out. The beam EB exiting from the third portion 110c (i.e., from the first multipole portion 110) has no two-fold astigmatism component as shown in FIG. 16. The beam EB leaving the first multipole element 110 enters the transfer lens 130.

In the transfer lens 130, the reciprocal space image formed by the first multipole element 110 is transferred to the second multipole element 120. Since the electron beam EB exiting from the first multipole element 110 has no two-fold astigmatism component, the beam EB can be made to enter into the vicinity of the center of the transfer lens 130.

In the second multipole element 120, an electromagnetic field is produced in which the X orbit EBx and Y orbit EBy of the electron beam EB are symmetrical to the X orbit EBx and Y orbit EBy of the electron beam EB assumed in the first multipole element 110. That is, the electromagnetic field produced by the second multipole element 120 is angularly shifted by 90 degrees with respect to the electromagnetic field produced by the first multipole element 110 around the optical axis OA. Consequently, in the second multipole element 120, the two-fold chromatic astigmatism component produced in the first multipole element 110 is canceled out by the two-fold chromatic astigmatism component produced in the second multipole element 120. As shown in FIG. 16, the orbit of the beam in the second multipole element 120 is angularly shifted by 90 degrees about the optical axis OA with respect to the orbit of the beam in the first multipole element 110.

In the portions 110a, 110b, 110c, 120a, 120b, and 120c of the multipole elements 110 and 120, negative chromatic aberration is produced by combination aberrations. Accordingly, negative chromatic aberration is produced by the whole chromatic aberration corrector 1000. Consequently, positive chromatic aberration in the objective lens 214 can be canceled out by the negative chromatic aberration in the chromatic aberration corrector 1000.

2.3. Principles

The principle on which a concave lens effect is produced by combination aberrations in a quadrupolar field having a thickness in the direction of travel of the electron beam and the principle on which two-fold chromatic astigmatism can be canceled out by the second multipole element 120 are next described.

For example, a quadrupole element and a hexapole element fundamentally produce a two-fold symmetric field and a three-fold symmetric field, respectively. When a field produced by such a multipole element is expanded into multiple terms by a multipole expansion technique, those symmetric fields are known as the primary terms. An actual multipole element produces slight amounts of fields due to higher order terms other than the primary terms. In a usually employed multipole element having no or slight thickness, higher order terms other than the primary terms are neglected in the intended application of the multipole element or are merely parasitic factors. However, if the thickness of the multipole element is increased, higher order terms other than the primary terms exhibit effects. A multipole element having a required length in the direction of travel of the electron beam to make use of the effects is a multipole element having a "thickness". Fields produced by the multipole element have "thicknesses".

Two-fold astigmatism caused by a static electric or magnetic field produced by a quadrupole element or by a quadrupolar field produced by superimposition of such static electric and magnetic fields (two-fold symmetric field) is now discussed. In calculating the orbit of an electron beam using a complex representation, let r be a position in a reciprocal space (focal plane). Let r' ($=\partial r/\partial z$) be a tilt. Let $\Omega$ be a complex angle. Let $\Omega'$ ($=\partial \Omega/\partial z$) be a derivative of a complex angle. Assuming that $A_2$ is a two-fold astigmatism coefficient per unit length, a two-fold astigmatism (geometric aberration) is given by the following formula using a complex conjugate of $A_2$ and $\Omega$.

$$A_2 \overline{\Omega}$$

where $\overline{\Omega}$ is a complex conjugate of $\Omega$.

A complex representation of a position $r_0$ and a tilt $r_0'$ of an electron beam at the exit surface of a quadrupole element is given by $$\begin{pmatrix} r_0 \\ r_0' \end{pmatrix}$$

A complex representation of another position $r_1$ and another tilt $r_1'$ of the electron beam at the incident surface of the quadrupole element is given by $$\begin{pmatrix} r_1 \\ r_1' \end{pmatrix}$$

Let f be the focal distance of an objective lens. If a specimen plane exists within this objective lens, and if the position and tilt of the electron beam at this position are represented in terms of a reciprocal space, they are given by $r=f\Omega$ and $r'=f\Omega'$, respectively.

Let t be the thickness of the multipole element in the direction of travel of the electron beam. The tilt of the electron beam at the exit surface of this multipole element is given by $$r_1' = r_0' + \sum_{n=1} \frac{\Omega_0}{(4n-1)!f^{4n-1}} |A_2|^{2n} t^{4n-1} + \qquad (1)$$

$$\sum_{n=1} \frac{\Omega_0'}{(4n)!f^{4n-1}} |A_2|^{2n} t^{4n} - \sum_{n=1} \frac{\overline{\Omega_0}}{(4n-3)!f^{4n-3}} A_2 \cdot |A_2|^{2(n-1)} t^{4n-3} -$$

$$\sum_{n=1} \frac{\overline{\Omega_0'}}{(4n-2)!f^{4n-3}} A_2 \cdot |A_2|^{2(n-1)} t^{4n-2}$$

where n is an integer (n>0).

In Eq. (1), the term having the coefficient $|A_2|^{2n}$ represents a lens action in cylindrical symmetry. Each term of positive sign (+) indicates a concave lens action. An effect produced by this action is also known as "a divergent focusing effect of the cylindrical symmetry type". On the other hand, each term having the coefficient $A_2 \cdot |A_2|^{2(n-1)}$ represents a two-fold astigmatism.

Let $A_{E2}$ be a two-fold astigmatism coefficient produced by a quadrupolar electric field (electric field with two-fold symmetry). The strength $|A_{E2}|$ of the quadrupolar electric field is given by $$|A_{E2}| \propto \frac{1}{U} \qquad (2)$$

where U is an accelerating voltage.

Let $A_{B2}$ be a two-fold astigmatism coefficient produced by a quadrupolar magnetic field (magnetic field of two-fold symmetry). The strength $|A_{B2}|$ of the quadrupolar magnetic field is given by $$|A_{B2}| \propto \frac{1}{\sqrt{U}} \qquad (3)$$

In an optical system having a concave lens action produced by a quadrupolar field having a thickness, the indexes of the coefficient $|A_2|$ of Eq. (1) are 2n and 2(n−1). If this is taken into consideration, the dependence of the deflecting force of the optical system on the accelerating voltage can be set to be in proportion to $1/U^N$ (where N is a positive integer) because of a combination of terms associated with the coefficient $|A_2|$.

Furthermore, in an optical system where the electric deflecting force and magnetic deflecting force on an electron beam with a given accelerating voltage are canceled out, the coefficient $|_{A2}|$ has a finite value for an electron beam with an accelerating voltage different from the given accelerating voltage. Consequently, the electron beam undergoes a concave lens action.

Where the objective lens having the focal distance of f indicated in Eq. (1) is of the magnetic type, the deflecting force of this objective lens is given by $$\frac{1}{f} \propto \frac{1}{U} \qquad (4)$$

As described previously, the dependence of the deflecting force produced by a quadrupolar field having a thickness on accelerating voltage is given by $1/U^N$. On the other hand, the dependence of the deflecting force produced by an objective lens as given by Eq. (4) on accelerating voltage is given by 1/U. That is, these two types of dependence on accelerating voltage are different greatly and so a quadrupolar field having a thickness has a refractive index different from that of an objective lens. Because of this difference, it can be seen that a concave lens action of a quadrupolar field having a thickness can be used to correct chromatic aberration in the objective lens.

If the thickness t of the quadrupole element is increased, the concave lens action becomes stronger as given by Eq. (1). Accordingly, it is possible to determine the thickness t in conformity with the required strength of concave lens action.

New two-fold astigmatisms are produced in a single stage of quadrupolar field as given by the terms of the right side of Eq. (1) having coefficient $A_2 \cdot |A_2|^{2(n-1)}$. However, these two-fold astigmatisms can be removed by providing two stages of quadrupoles as given below. Two-fold symmetrical fields produced by the two stages of quadrupoles, respectively, are made analogous and antisymmetric. Specifically, two multipole elements of the same structure are disposed, and voltages of opposite polarities are applied to the multipole elements. Alternatively, the multipole elements are excited with currents having opposite polarities. Assuming that the thicknesses of the quadrupole elements taken along the optical axis are the same, the tilt $r_2'$ of the electron beam at the exit surface of the second stage of quadrupole element is given by $$r_2' = -2\sum_{n=1} \frac{\Omega_0}{(4n-1)! f^{4n-1}} |A_2|^{2n} t^{4n-1} + \tag{5}$$
$$\sum_{n=1}\sum_{m=1} \left[ \frac{16mn - 4n - 4m}{(4n)!(4m)!} \right] \frac{\Omega_0}{f^{4n+4m-1}} |A_2|^{2n+2m} t^{4n+4m-1} +$$
$$\sum_{n=1}\sum_{m=1} \left[ \frac{-16mn + 12n + 12m - 8}{(4n-2)!(4m-2)!} \right] \frac{\Omega_0}{f^{4n+4m-5}} |A_2|^{2n+2m-2} t^{4n+4m-5}$$

where n and m are positive integers.

If two stages of quadrupole elements are arranged with opposite polarities as given by Eq. (5), the term having coefficient $A_2 \cdot |A_2|^{2(n-1)}$ of two-fold astigmatism shown in Eq. (1) disappears. Since terms having positive sign (+) of the right side of this equation show a concave lens action, only a lens action in cylindrical symmetry necessary for aberration correction is extracted. In this way, the concave lens action of the two stages of quadrupole elements each having a thickness can correct chromatic aberration in the objective lens without producing two-fold astigmatism.

The chromatic aberration corrector 1000 and the electron microscope 200 associated with the present embodiment have the following features. In the chromatic aberration corrector 1000, the first multipole element 110 has the first portion 110a, the second portion 110b, and the third portion 110c arranged along the optical axis OA. Each of the three portions 110a-110c has a thickness in the direction of travel of the electron beam EB. Consequently, the first portion 110a and the third portion 110c of the first multipole element 110 can produce concave lens effects by a combination of aberrations in quadrupolar fields each having a thickness in the direction of travel of the electron beam. The second portion 110b of the first multipole element 110 can produce a convex lens effect by a combination of aberrations in a quadrupolar field having a thickness in the direction of travel of the electron beam.

The portions 110a, 110b, and 110c of the first multipole element 110 produce quadrupolar fields of superimposed electric and magnetic fields. Consequently, a greater negative chromatic aberration can be obtained than where a quadrupolar field is produced using a quadrupolar electric or magnetic field alone.

In the first portion 110a of the first multipole element 110 of the chromatic aberration corrector 1000, the quadrupolar electric field is set stronger than the quadrupolar magnetic field. In the second portion 110b, the quadrupolar magnetic field is set stronger than the quadrupolar electric field. In the third portion 110c, the quadrupolar electric field is set stronger than the quadrupolar magnetic field. The two-fold astigmatism component produced in the second portion 110b is opposite in sign to the two-fold astigmatism components produced in the first portion 110a and third portion 110c. Consequently, the electron beam EB free from two-fold astigmatism components can be produced from the first multipole element 110. Therefore, the electron beam EB can be made to impinge on the vicinities of the center of the transfer lens 130. Thus, with the chromatic aberration corrector 1000, the effects of aberrations in the transfer lens 130 can be reduced. Axial alignments can be made easily.

Where an electron beam having two-fold astigmatism is emitted from the first multipole element, for example, the transfer lens located between the first and second multipole elements spreads the beam. Generally, when an electron beam passes through an end of a lens, a large amount of aberration occurs. For this reason, when an electron beam having two-fold astigmatism exits from the first multipole element, the beam may undergo a large amount of aberration from the transfer lens. As a result, axial alignments will be made difficult or complicated. The chromatic aberration corrector 1000 permits the electron beam EB free of two-fold astigmatism components to emanate from the first multipole element 110 and so the effects of aberrations in the transfer lens 130 can be reduced. Hence, axial alignments can be made easily.

Furthermore, in the first multipole element 110, the orbits EBx and EBy of the electron beam can be varied greatly in the three portions (three stages) 110a, 110b, and 110c. Therefore, chromatic aberration can be produced at higher efficiency than where there is only one stage of multipole element. This makes it possible to reduce the thickness of the first multipole element 110, taken in the direction of travel of the beam. For example, in a multipole element, field charging and quite slight voltage instability are major causes leading to a deterioration of the final resolution of the electron microscope. As the thickness of a multipole element taken in the direction of travel of the electron beam increases, an electric field is subjected to these noise components over a greater distance, whereby the electron beam is disturbed to a greater extent. Accordingly, the resolution can be improved by reducing the thickness of the multipole element. In the chromatic aberration corrector 1000, the first multipole element 110 can be shortened as described previously. Hence, the resolution of the electron microscope 200 can be improved.

In the chromatic aberration corrector 1000, the second electromagnetic field produced by the second multipole element 120 is angularly shifted by 90 degrees about the optical axis with respect to the first electromagnetic field produced by the first multipole element 110. In consequence, the two-fold chromatic astigmatism component produced in the first multipole element 110 can be canceled out by the two-fold chromatic astigmatism component produced in the second multipole element 120. As a result, in the whole chromatic aberration corrector 1000, two-fold chromatic astigmatism components can be eliminated.

In the chromatic aberration corrector 1000, the quadrupolar electric field component of the first electromagnetic field produced by the first multipole element 110 is constant along the optical axis OA. Thus, the quadrupolar electric field can be produced by a simple structure.

Since the chromatic aberration corrector 1000 contains the multipole lens 100, first and second static magnetic fields can be produced by the multipole lens 100. Consequently, chromatic aberration can be corrected.

In the electron microscope 200, the chromatic aberration corrector 1000 can correct aberrations by producing negative chromatic aberrations efficiently. Accordingly, in the electron microscope 200, the length or thickness of the first multipole element 110 can be reduced and thus the resolution can be improved. Furthermore, in the electron microscope 200, axial alignments can be made easily because it is equipped with the chromatic aberration corrector 1000.

2.4. Modifications

Modifications of the chromatic aberration corrector associated with the present embodiment are next described with reference to some drawings.

(1) First Modification

Figure 17:
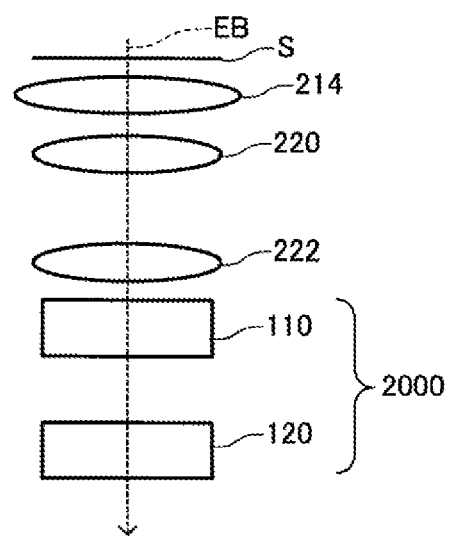
FIG. 17 is an optical ray diagram of the optical system of a chromatic aberration corrector associated with a first modification of the first embodiment.
Figure 18A:
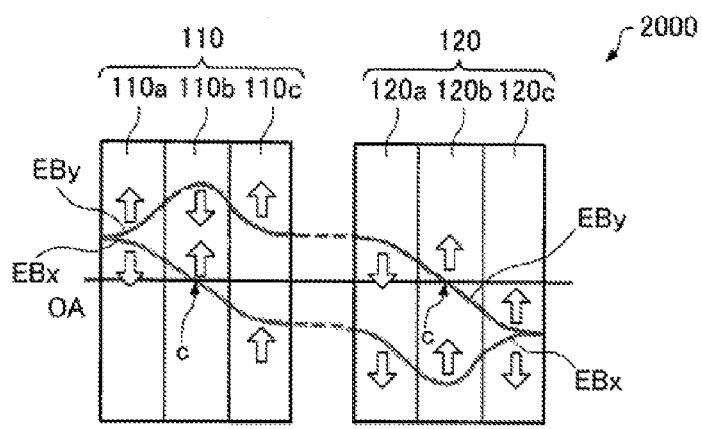
FIG. 18A is a diagram illustrating the configuration of the chromatic aberration corrector associated with the first modification of the first embodiment.
Figure 18B:
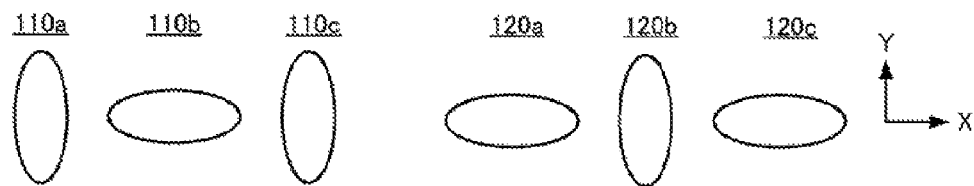
FIG. 18B is a diagram illustrating two-fold astigmatism components in various parts of the chromatic aberration corrector shown in FIG. 18A.
Figure 18C:
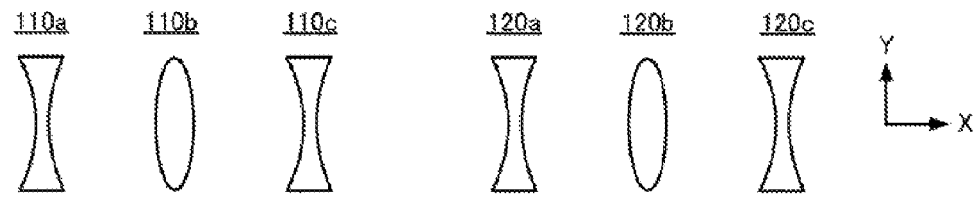
FIG. 18C is a diagram illustrating lens effects produced in various parts of the chromatic aberration corrector shown in FIG. 18A.
Figure 18D:
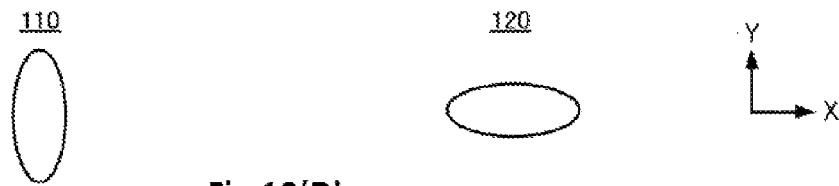
FIG. 18D is a diagram illustrating two-fold chromatic astigmatism components produced by the first and second multipole elements of the chromatic aberration corrector shown in FIG. 18A.

A first modification is first described. FIG. 17 shows the optical system of a chromatic aberration corrector, 2000, associated with the first modification. FIGS. 18A-18D show a first multipole element 110 and a second multipole element 120 of the chromatic aberration corrector 2000. FIG. 18A shows the configuration of the chromatic aberration corrector 2000. In FIG. 18A, an X orbit EBx is shown as a typical orbit of an electron beam EB in the X-axis direction. A Y orbit EBy is shown as a typical orbit of the beam EB in the Y-axis direction. FIG. 18B shows two-fold astigmatism components in various portions 110a, 110b, 110c, 120a, 120b, and 120c of the multipole elements 110 and 120. FIG. 18C shows lens effects produced in the various portions 110a, 110b, 110c, 120a, 120b, and 120c of the multipole elements 110 and 120. FIG. 18D shows two-fold chromatic astigmatism components produced in the first multipole element 110 and second multipole element 120. Those members of the chromatic aberration corrector 2000 which are similar in function with their respective counterparts of the aforementioned chromatic aberration corrector 1000 are indicated by the same reference numerals as in the above-cited figures and a detail description thereof is omitted.

The above-described chromatic aberration corrector 1000 is configured including the first multipole element 110, the second multipole element 120, and the transfer lens 130 disposed between the first multipole element 110 and the second multipole element 120 as shown in FIGS. 10 and 11.

In contrast, the chromatic aberration corrector 2000 is configured including the first multipole element 110 and the second multipole element 120 as shown in FIGS. 17 and 18. That is, in the chromatic aberration corrector 2000, the transfer lens 130 is not disposed between the first multipole element 110 and the second multipole element 120. The distance between the first multipole element 110 and the second multipole element 120 is so set that off-axis aberrations are reduced. In other respects, the chromatic aberration corrector 2000 is similar in configuration with the above-described chromatic aberration corrector 1000 and a description of such similar parts is omitted. The chromatic aberration corrector 2000 can yield the same advantageous effects as the aforementioned chromatic aberration corrector 1000.

(2) Second Modification

Figure 19:
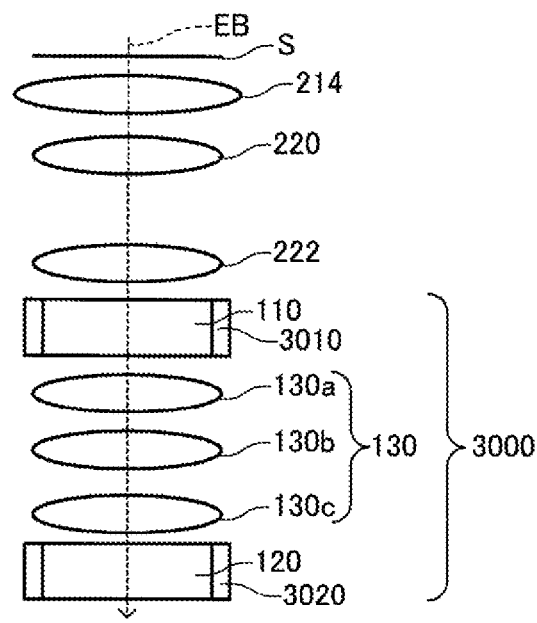
FIG. 19 is an optical ray diagram of the optical system of a chromatic aberration corrector associated with a second modification of the first embodiment.

A second modification is next described. FIG. 19 shows the optical system of a chromatic aberration corrector, 3000, associated with the second modification. Those members of the chromatic aberration corrector 3000 which are similar in function with their respective counterparts of the aforementioned chromatic aberration corrector 1000 are indicated by the same reference numerals as in the above-cited figures and a detail description thereof is omitted.

The chromatic aberration corrector 3000 includes a third multipole element 3010 for superimposing an electric field of 4-fold symmetry on the first electromagnetic field produced by the first multipole element 110 and a fourth multipole element 3020 for superimposing an electric field of 4-fold symmetry on the second electromagnetic field produced by the second multipole element 120. Consequently, the chromatic aberration corrector 3000 can correct spherical aberration in addition to chromatic aberration.

The third multipole element 3010 superimposes the electric field of 4-fold symmetry on the quadrupolar field of superimposed electric and magnetic fields produced by the second portion 110b (FIG. 11) of the first multipole element 110. The fourth multipole element 3020 superimposes the electric field of 4-fold symmetry on the quadrupolar field of superimposed electric and magnetic fields produced by the second portion 120b of the second multipole element 120. For example, each of the third multipole element 3010 and fourth multipole element 3020 is an octopole element.

Where the electron beam EB has two-fold astigmatism, if a four-fold symmetric field is superimposed on it, a negative spherical aberration $-C_s$ is produced as given below.

$$-C_s \propto A_2^2 \cdot A_4 \quad (6)$$

where $A_2$ is a two-fold astigmatism coefficient and $A_4$ is a four-fold astigmatism coefficient. Chromatic aberration and spherical aberration can be corrected simultaneously by superimposing an astigmatic field of four-fold symmetry in this way.

The chromatic aberration corrector 3000 makes it possible to correct spherical aberration in addition to chromatic aberration. The third multipole element 3010 and fourth multipole element 3020 of the chromatic aberration corrector 3000 may superimpose magnetic fields of four-fold symmetry instead of electric fields of four-fold symmetry. Also in this case, spherical aberration can be corrected in addition to chromatic aberration.

(3) Third Modification

Figure 20:
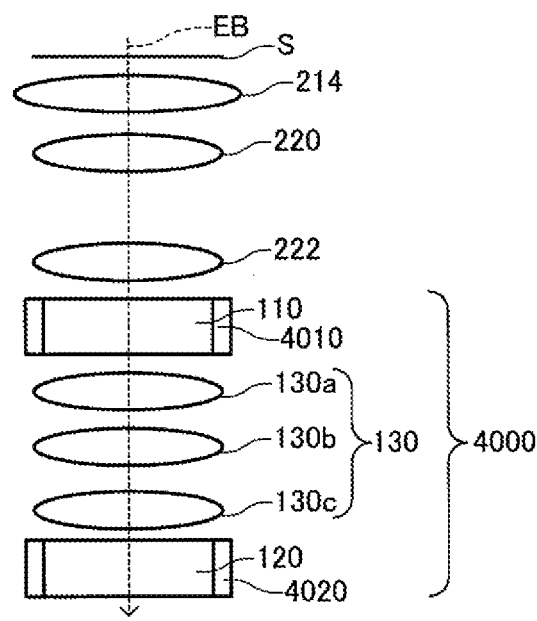
FIG. 20 is an optical ray diagram of the optical system of a chromatic aberration corrector associated with a third embodiment of the first embodiment.

A third modification is next described. FIG. 20 shows the optical system of a chromatic aberration corrector, 4000, associated with the third modification. Those members of the chromatic aberration corrector 4000 which are similar in function with their respective counterparts of the aforementioned chromatic aberration corrector 1000 are indicated by the same reference numerals as in the above-cited figures and a detail description thereof is omitted.

The chromatic aberration corrector 4000 includes a third multipole element 4010 for superimposing an electric field of three-fold symmetry on the first electromagnetic field produced by the first multipole element 110 and a fourth multipole element 4020 for superimposing an electric field of three-fold symmetry on the second electromagnetic field produced by the second multipole element 120. Consequently, the chromatic aberration corrector 4000 can correct spherical aberration in addition to chromatic aberration.

The third multipole element 4010 superimposes the electric field of three-fold symmetry on the quadrupolar field of superimposed electric and magnetic fields produced by the first portion 110a or third portion 110c of the first multipole element 110. The fourth multipole element 4020 superimposes the electric field of three-fold symmetry on the quadrupolar field of superimposed electric and magnetic fields produced by the first portion 120a or third portion 120c of the second multipole element 120. Each of the third multipole element 4010 and fourth multipole element 4020 is a hexapole element, for example.

Where the electron beam EB is spread in the multipole elements 110 and 120, if a three-fold astigmatism is superimposed, spherical aberration can be corrected. Therefore, the chromatic aberration corrector 4000 makes it possible to correct spherical aberration in addition to chromatic aberration.

The third multipole element 4010 and fourth multipole element 4020 of the chromatic aberration corrector 400 may superimpose magnetic fields of three-fold symmetry instead of electric fields of three-fold symmetry. Also in this case, spherical aberration can be corrected in addition to chromatic aberration.

(4) Fourth Modification

Figure 21:
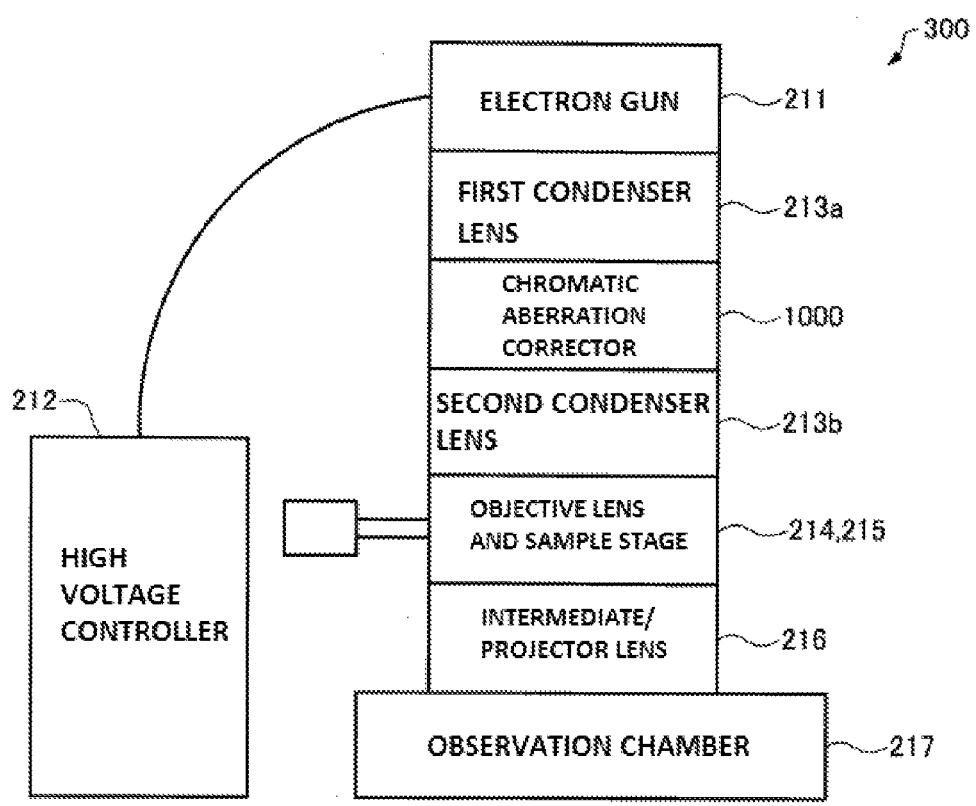
FIG. 21 is a block diagram of an electron microscope associated with a fourth modification of the first embodiment.

A fourth modification is next described. FIG. 21 shows the configuration of an electron microscope 300 associated with the fourth modification. Those members of the electron microscope 300 which are similar in function with their respective counterparts of the aforementioned electron microscope 200 are indicated by the same reference numerals as in the above-cited figures and a detail description thereof is omitted.

In the above-described electron microscope 200, a chromatic aberration corrector associated with the present invention is used as an aberration corrector for an imaging system as shown in FIG. 7. In contrast, in the electron microscope 300 associated with a fourth modification, a chromatic aberration corrector associated with the present invention is used as a chromatic aberration corrector for an illumination system. A case in which the chromatic aberration corrector 1000 is used as a chromatic aberration corrector associated with the present invention is described below.

The electron microscope 300 is configured including the electron gun 211, a high voltage controller 212, a first condenser lens 213a, the chromatic aberration corrector 1000, a second condenser lens 213b, the objective lens 214, the sample stage 215, the intermediate/projector lens system 216, and the observation chamber 217.

The electron gun 211 has a high-voltage power supply under control of the high voltage controller 212 and produces an electron beam. The first condenser lens 213a focuses the electron beam produced by the electron gun 211. The focused beam enters the chromatic aberration corrector 1000. The chromatic aberration corrector 1000 corrects aberrations in the first condenser lens 213a. The electron beam whose chromatic aberration has been corrected by the chromatic aberration corrector 1000 is focused by the second condenser lens 213b. The focused beam then passes through the objective lens 214 and sample stage 215.

The intermediate/projector lens system 216 cooperates with the objective lens 214 to constitute an imaging system. The intermediate/projector lens system 216 focuses the beam onto a camera (not shown) within the observation chamber 217. Since the electron microscope 300 contains the chromatic aberration corrector 1000, chromatic aberration in the illuminating system (i.e., the first condenser lens 213a) can be corrected. Accordingly, the electron microscope 300 can have high resolution. Furthermore, in the electron microscope 300, the chromatic aberration corrector 1000 can correct aberrations by efficiently producing negative chromatic aberrations. Accordingly, with the electron microscope 300, the length or thickness of the first multipole element 110 can be reduced and the resolution can be improved. In addition, the electron microscope 300 is equipped with the chromatic aberration corrector 1000 and so axial alignments can be facilitated.

It is to be understood that the present invention is not restricted to the above-described embodiments and that the embodiments can be practiced in various modified forms without departing from the gist and scope of the present invention.

In the description of the above-described embodiments and modifications, the multipole lens 100 is applied to chromatic aberration correctors. The multipole lens associated with the present invention may be applied to a spherical aberration corrector.

The above-described embodiments and modifications are merely exemplary and the present invention is not restricted to them. For example, the embodiments and modifications may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. A multipole lens comprising:
a plurality of lens subassemblies stacked on top of each other, each of the lens subassemblies having a yoke and polar elements, each of the polar elements having a base portion magnetically coupled to the yoke and a front end portion magnetically coupled to said base portion; and
magnetic field separators made of a nonmagnetic material and mounted between said front end portions which are successively adjacent to each other in the direction of stacking of said lens subassemblies.

2. The multipole lens as set forth in claim 1, wherein said magnetic field separators have electrical conductivity.

3. The multipole lens as set forth in claim 1, further comprising terminals for applying voltages to said front end portions.

4. The multipole lens as set forth in claim 1, wherein said base portions are spaced from said front end portions.

5. The multipole lens as set forth in claim 1, wherein said polar elements which are successively adjacent to each other in the direction of stacking produce electric fields of equal strength, and wherein said polar elements which are successively adjacent to each other in the direction of stacking produce magnetic fields of different strengths.

6. The multipole lens as set forth in claim 1, wherein said magnetic field separators are in contact with respective ones of said front end portions which are adjacent to their respective magnetic field separators in the direction of stacking.

7. The multipole lens as set forth in claim 1, wherein first support portions made of a nonmagnetic material are mounted between said base portions which are successively adjacent to each other in the direction of stacking.

8. The multipole lens as set forth in claim 1, wherein second support portions made of a nonmagnetic material are mounted between said yokes which are successively adjacent to each other in the direction of stacking.

9. The multipole lens as set forth in claim 1, further comprising:
   first coils mounted on said base portions, respectively; and
   second coils mounted on said base portions, respectively, each of the second coils having a fewer number of turns than each of said first coils.

10. An aberration corrector including a multipole lens as set forth in claim 1.

11. The aberration corrector as set forth in claim 10, wherein said multipole lens produces an electromagnetic field for canceling out chromatic aberration.

12. An electron microscope including an aberration corrector as set forth in claim 10.

13. The electron microscope as set forth in claim 12, wherein vacuum partitions are disposed between said base portions and said front end portions.

\* \* \* \* \*